(12) United States Patent
Chiu et al.

(10) Patent No.: US 10,833,029 B2
(45) Date of Patent: Nov. 10, 2020

(54) ELECTRONIC DEVICE AND METHOD OF MANUFACTURING THE SAME

(71) Applicant: NANYA TECHNOLOGY CORPORATION, New Taipei (TW)

(72) Inventors: Hsih-Yang Chiu, Taoyuan (TW); Ting-Cih Kang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 20 days.

(21) Appl. No.: 16/217,800

(22) Filed: Dec. 12, 2018

(65) Prior Publication Data

US 2020/0176403 A1 Jun. 4, 2020

Related U.S. Application Data

(60) Provisional application No. 62/773,506, filed on Nov. 30, 2018.

(51) Int. Cl.
*H01L 23/66* (2006.01)
*H01L 49/02* (2006.01)

(52) U.S. Cl.
CPC .............. *H01L 23/66* (2013.01); *H01L 28/60* (2013.01); *H01L 2223/6666* (2013.01); *H01L 2223/6672* (2013.01)

(58) Field of Classification Search
None
See application file for complete search history.

(56) References Cited

PUBLICATIONS

Office Action dated Jan. 13, 2020 related to Taiwanese Application No. 108126674.

*Primary Examiner* — Long Pham
(74) *Attorney, Agent, or Firm* — Muncy, Geissler, Olds and Lowe, P.C.

(57) ABSTRACT

The present disclosure relates to an electronic device and a method of manufacturing a filtering component of the electronic device. The electronic device includes a semiconductor component, an insulating layer, at least one contact plug, and a filtering component. The insulating layer is disposed on the semiconductor component. The contact plug penetrates through the insulating layer. The filtering component is disposed on the insulating layer and the contact plug. The filtering component includes a bottom electrode, an isolation layer, a top electrode, and a dielectric layer. The bottom electrode is divided into a first segment connected to the contact plug and a second segment separated from the first segment. The isolation layer is disposed on the bottom electrode, the top electrode is disposed in the isolation layer, and the dielectric layer is disposed between the bottom electrode and the top electrode.

12 Claims, 36 Drawing Sheets

ELECTRONIC DEVICE AND METHOD OF MANUFACTURING THE SAME

PRIORITY CLAIM AND CROSS-REFERENCE

This application claims the priority benefit of U.S. provisional application Ser. No. 62/773,506, filed on Nov. 30, 2018. The entirety of the above-mentioned patent application is hereby incorporated by reference herein and made a part of this specification.

TECHNICAL FIELD

The present disclosure relates to an electronic device and a method of manufacturing the same, and more particularly, to an electronic device with an integral filtering component and a method of manufacturing the electronic device.

DISCUSSION OF THE BACKGROUND

An integrated circuit device using semiconductor devices may be fabricated by integrating various individual circuit devices, e.g., an electric field effect transistor, a resistor, a capacitor, etc., into one chip. Generally, such individual devices have been continuously scaled down to provide enhanced performance in relation to operating speed and/or power consumption. For example, in dynamic random access memory (DRAM), demands for improving the operating speed and power consumption have resulted in increased integration of DRAM devices.

However, if a clock frequency of a semiconductor device is increased for faster operating speed, noise may also increase. In a DRAM, when the operating speed is increased, noise may increase; and thus the operating speed may decrease.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides an electronic device. The electronic device includes a semiconductor component, an insulating layer, at least one contact plug, and a filtering component. The insulating layer is disposed on the semiconductor component. The contact plug penetrates through the insulating layer. The filtering component is disposed on the insulating layer and the contact plug. The filtering component includes a bottom electrode, an isolation layer, a top electrode, and a dielectric layer. The bottom electrode is divided into a first segment connected to the contact plug and a second segment separated from the first segment. The isolation layer is disposed on the bottom electrode, the top electrode is disposed in the isolation layer, and the dielectric layer is disposed between the bottom electrode and the top electrode.

In some embodiments, the isolation layer is further disposed in a gap between the first segment and the second segment.

In some embodiments, a lower surface of the bottom electrode is coplanar with a bottom surface of the isolation layer opposite to a top surface of the isolation layer.

In some embodiments, the dielectric layer extends along the top surface of the isolation layer and encircles the top electrode disposed in the isolation layer.

In some embodiments, the top electrode is further disposed over the top surface.

In some embodiments, the first segment is surrounded by the second segment.

In some embodiments, a footprint of the first segment is smaller than that of the second segment.

Another aspect of the present disclosure provides an electronic device. The electronic device includes a semiconductor component, an insulating layer, at least one contact plug, and a filtering component. The insulating layer is disposed on the semiconductor component. The contact plug penetrates through the insulating layer. The filtering component is disposed on the insulating layer and the contact plug. The filtering component includes a blanket bottom electrode, an isolation layer, a dielectric layer, and a top electrode. The blanket bottom electrode is disposed on the insulating layer and the contact plug, and the blanket bottom electrode is connected to the contact plug. The isolation layer is disposed on the blanket bottom electrode. The top electrode extends along a top surface of the isolation layer and is disposed within the isolation layer, the top electrode includes a first segment and a second segment separated from each other. The dielectric layer is disposed between the top electrode and the isolation layer.

In some embodiments, a gap is disposed between the first segment and the second segment, and the dielectric layer is exposed through the gap.

In some embodiments, portions of the dielectric layer are exposed to a gap between the first segment and the second segment.

Another aspect of the present disclosure provides a method of manufacturing an electronic device. The method includes steps of providing a blanket bottom electrode; patterning the blanket bottom electrode to form a first segment and a second segment separated from each other; depositing an isolation layer on the first segment, on the second segment, and over a gap between the first segment and the second segment; providing a first photoresist layer on the isolation layer; exposing the first photoresist layer to form a first photoresist pattern having a plurality of first exposed portions and a plurality of first unexposed portions; providing a second photoresist layer on the first photoresist pattern; exposing the second photoresist layer to form a second photoresist pattern having a plurality of second exposed portions and a plurality of second unexposed portions; performing an etching process to form a plurality of trenches at intersections wherein the first exposed portions and the second exposed portions intersect; depositing a dielectric layer on the isolation layer and in the trenches; and depositing a top electrode on the dielectric layer.

In some embodiments, the second unexposed portions are disposed over the gap.

In some embodiments, the first exposed portions and the first unexposed portions are alternatingly arranged along a first direction, and the second exposed portions and the second unexposed portions are alternatingly arranged along a second direction perpendicular to the first direction.

In some embodiments, the method further includes a step of removing the first unexposed portions and the second unexposed portions before the deposition of the dielectric layer.

In some embodiments, the method further includes steps of providing semiconductor component; depositing an insulating layer on the semiconductor component; and forming at least one contact plug in the insulating layer before the providing of the blanket bottom electrode.

In some embodiments, the first segment is in contact with the contact plug.

In some embodiments, the dielectric layer is a conformal layer.

Another aspect of the present disclosure provides a method of manufacturing an electronic device. The method includes steps of providing a blanket bottom electrode; depositing an isolation layer on the blanket bottom electrode; coating a first photoresist layer on the isolation layer; exposing the first photoresist layer to form a first photoresist pattern having a plurality of first exposed portions and a plurality of first unexposed portions; coating a second photoresist layer on the first photoresist pattern; exposing the second photoresist layer to form a second photoresist pattern having a plurality of second exposed portions and a plurality of second unexposed portions; performing an etching process to form a plurality of trenches at intersections wherein the first exposed portions and the second exposed portions intersect; depositing a dielectric layer on the isolation layer and in the trenches; depositing a top electrode on the dielectric layer; and patterning the top electrode to form a first segment and a second segment separated from each other.

In some embodiments, the first exposed portions and the first unexposed portions are alternatingly arranged along a first direction, and the second exposed portions and the second unexposed portions are alternatingly arranged along a second direction perpendicular to the first direction.

In some embodiments, the method further includes a step of removing the first unexposed portions and the second unexposed portions before the deposition of the dielectric layer.

In some embodiments, the dielectric layer is a conformal layer.

In some embodiments, the method further includes steps of providing semiconductor component; depositing an insulating layer on the semiconductor component; and forming at least one contact plug in the insulating layer before the providing of the blanket bottom electrode.

With the above-mentioned configurations of the electronic device, the filtering components include at least one decoupling capacitor functioning as a noise filter and at least one dummy capacitor functioning as a reinforced structure; thus, noise can be effectively reduced and operation speed of the electronic device can be improved.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
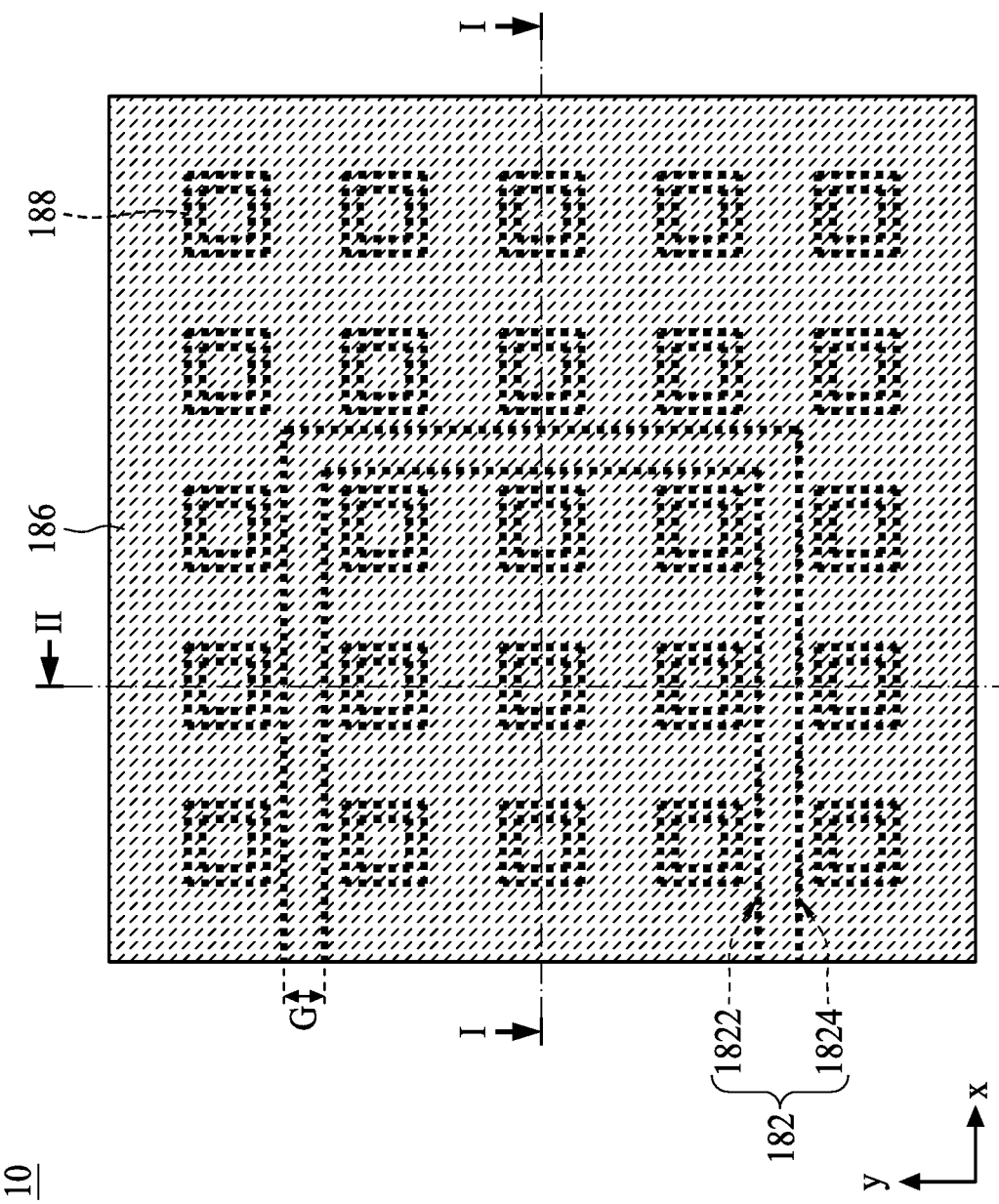
FIG. 1 is a top view of an electronic device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
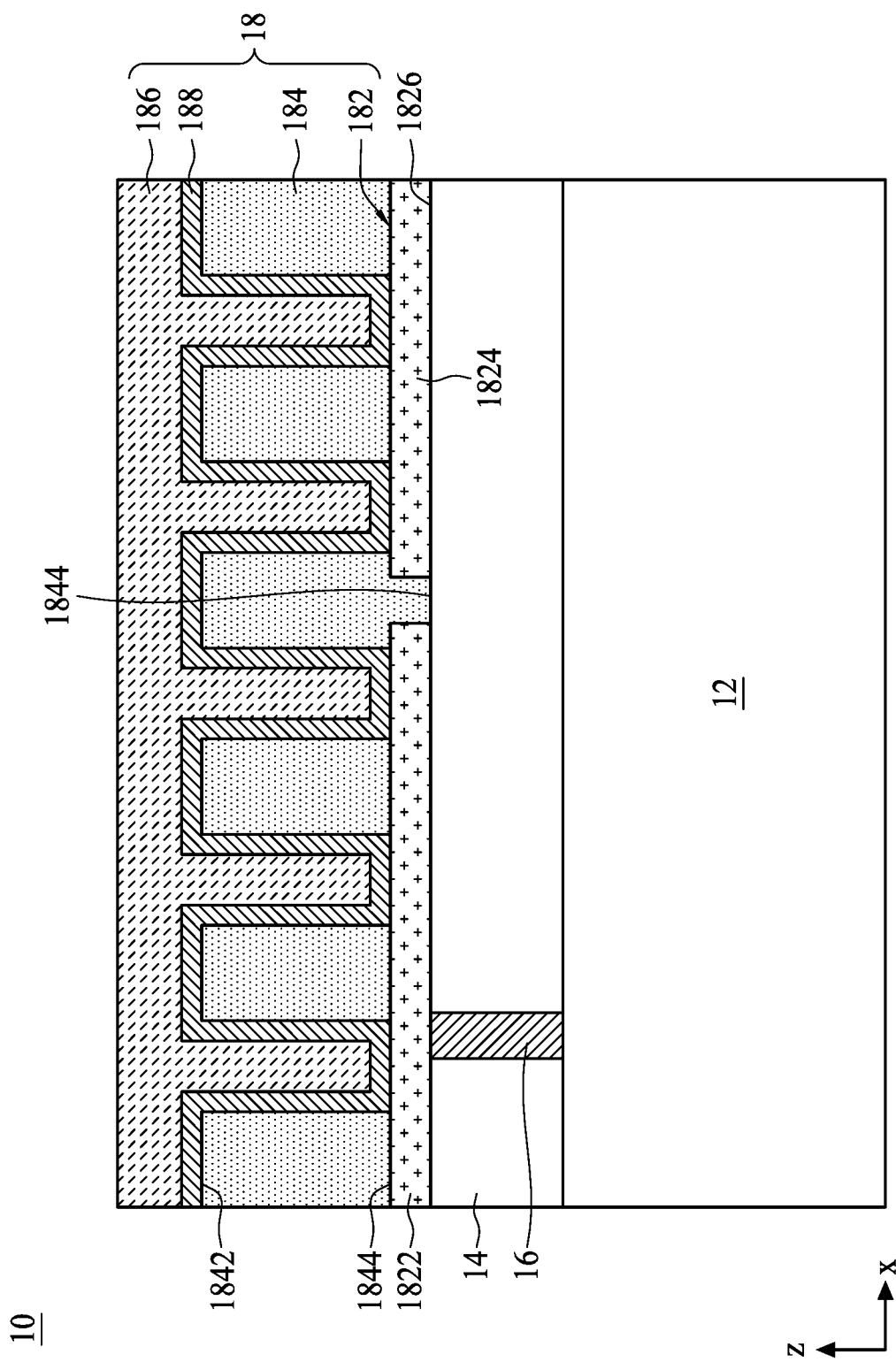
FIG. 2 is a cross-sectional view taken along the line I-I illustrated in FIG. 1.
Figure 3:
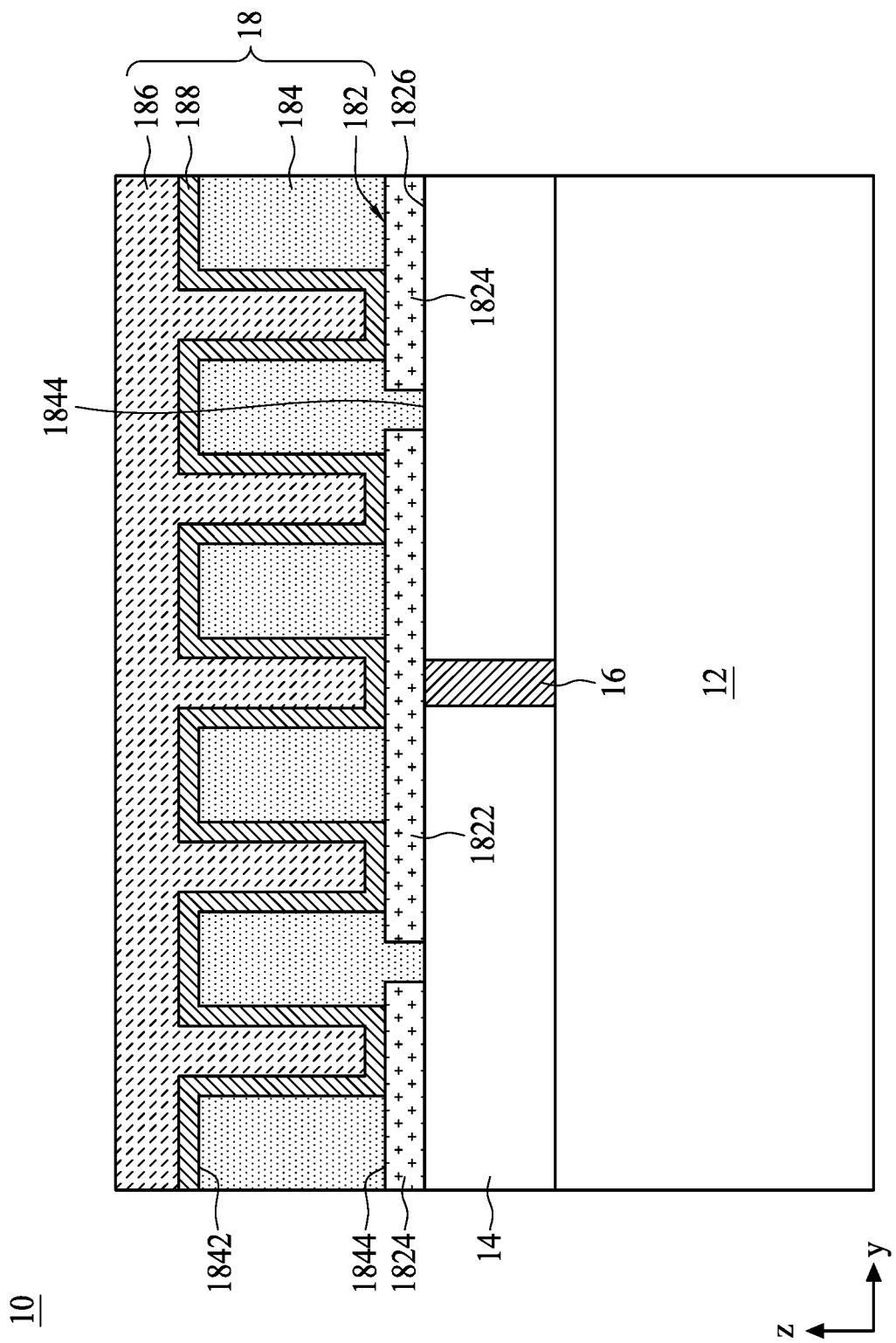
FIG. 3 is a cross-sectional view taken along the line II-II illustrated in FIG. 1.

FIG. 1 is a top view of an electronic device 10 in accordance with some embodiments of the present disclosure, FIG. 2 is a cross-sectional view taken along the line I-I illustrated in FIG. 1, and FIG. 3 is a cross-sectional view taken along the line II-II illustrated in FIG. 1. Referring to FIGS. 1 to 3, the electronic device 10 includes a semiconductor component 12, an insulating layer 14 disposed on the semiconductor component 12, at least one contact plug 16 penetrating through the insulating layer 14, and a filtering component 18 disposed on the insulating layer 14 and the contact plug 16. In some embodiments, the filtering component 18 is electrically coupled to the semiconductor component 12 through the contact plug 16.

In some embodiments, the filtering component 18 is used as a low frequency bypass filter. In some embodiments, the filtering component 18 includes a bottom electrode 182 divided into a first segment 1822 and a second segment 1824 separated from each other, an isolation layer 184 disposed on the bottom electrode 182, a top electrode 186 extending along a top surface 1842 of the isolation layer 184 and disposed within the isolation layer 184, and a dielectric layer 188 between the bottom electrode 182 and the top electrode 186.

In some embodiments, the first segment 1822 is connected to the contact plug 16. In some embodiments, a gap G is formed between the first segment 1822 and the second segment 1824. In some embodiments, the first segment 1822 is surrounded by the second segment 1824. In some embodiments, the isolation layer 184 is further disposed in the gap G for connecting the first segment 1822 to the second segment 1824. In some embodiments, a lower surface 1822 of the bottom electrode 182 is coplanar with a bottom surface 1844, opposite to the top surface 1842 of the isolation layer.

In some embodiments, the dielectric layer 188 extends along the top surface 1842 of the isolation layer 184 and is disposed within the isolation layer 184 to encircle the top electrode 186. In some embodiments, the dielectric layer 188 is a conformal layer. In some embodiments, the dielectric layer 188 is sandwiched between the bottom electrode 182 and the top electrode 186, such that when a power source is applied across the semiconductor component 12 and the filtering component 18, the first segment 1822 of the bottom electrode 182 (having a small footprint), the top electrode 186, and the dielectric layer 188 collectively form at least one decoupling capacitor for noise mitigation in a high frequency application of the electronic device 10. In some embodiments, the second segment 1824 of the bottom electrode 182 (having a large footprint), the top electrode 186, and the dielectric layer 188 collectively form at least one dummy capacitor for preventing the decoupling capacitor from collapse, wherein the collapse can occur due to the second segment 1824 being disconnected from the contact plug 16 and separated from the first segment 1822, such that power source applied to the electronic device 10 cannot be conducted to the second segment 1824.

Figure 4:
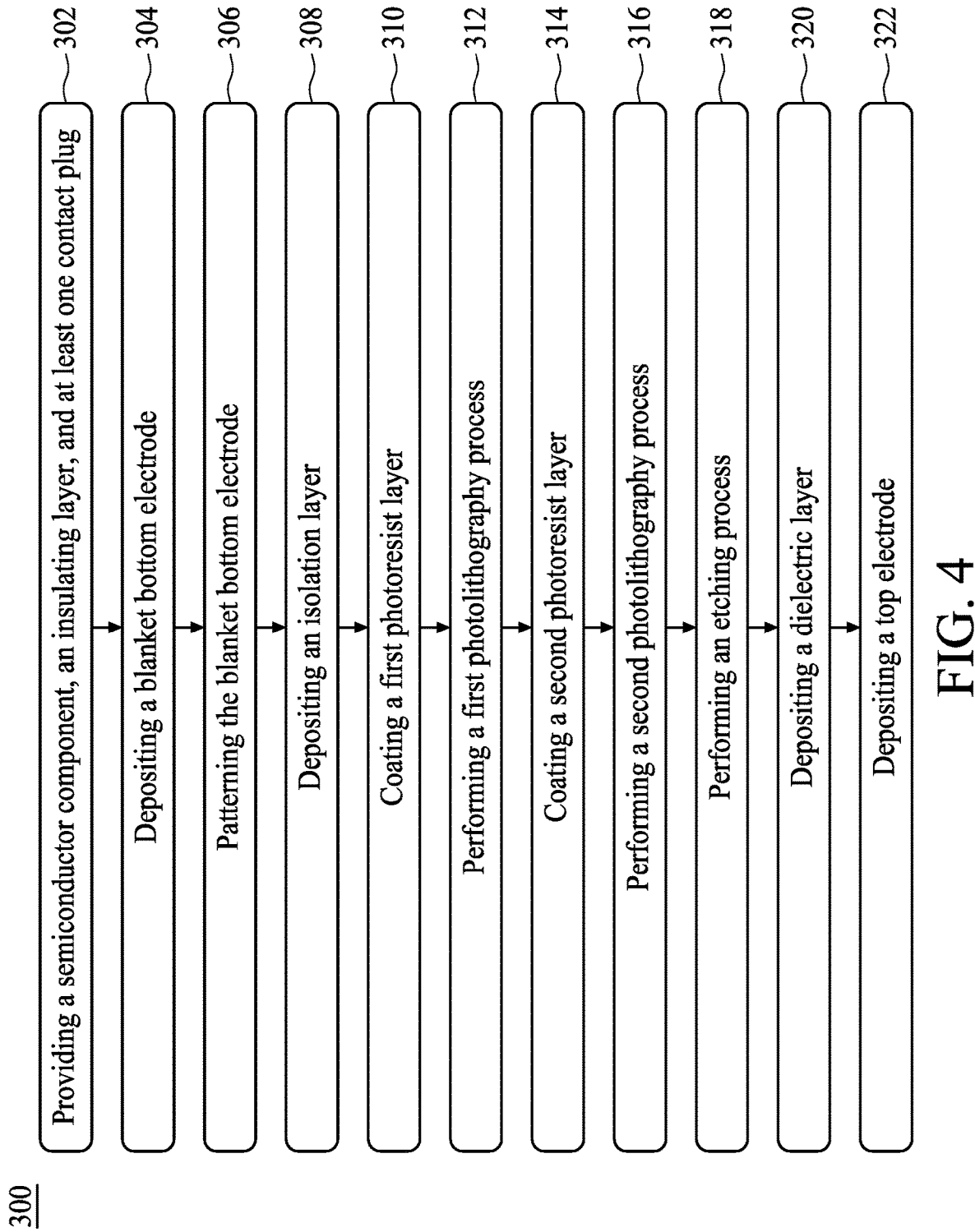
FIG. 4 is a flow diagram illustrating a method of manufacturing an electronic device in accordance with some embodiments of the present disclosure.

FIG. 4 is a flow diagram illustrating a method 300 for manufacturing an electronic device 10 in accordance with some embodiments of the present disclosure. FIGS. 5 to 23 are schematic diagrams illustrating various fabrication stages constructed according to the method 300 for manufacturing the electronic device 10 in accordance with some embodiments of the present disclosure. The stages shown in FIGS. 5 to 23 are also illustrated schematically in the process flow in FIG. 4. In the following discussion, the fabrication stages shown in FIGS. 5 to 23 are discussed in reference to the process steps in FIG. 4.

Figure 5:
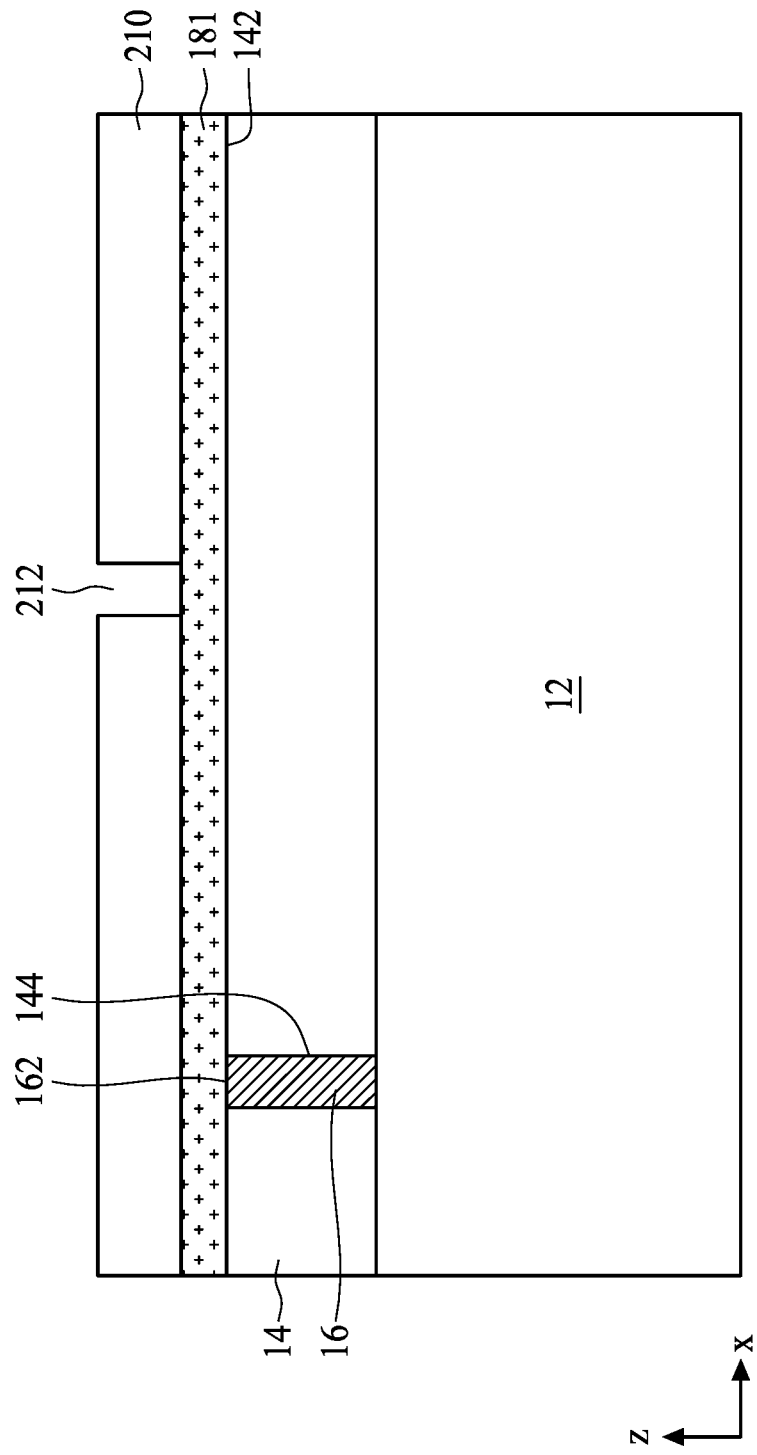
FIG. 5 is a cross-sectional view of an intermediate stage in the manufacture of the electronic device in accordance with some embodiments of the present disclosure.

Referring to FIG. 5, a semiconductor component 12, an insulating layer 14, and at least one contact plug 16 are provided according to a step 302 in FIG. 4. In some embodiments, the semiconductor component 12 may be any functional component such as a digital device component formed by at least one semiconductor process in advance. In some embodiments, the insulating layer 14 is formed on the semiconductor component 12 and then planarized, for example by a chemical mechanical polishing (CMP) process, to obtain a flat upper surface 142. In some embodiments, the insulating layer 14 includes oxide. In some embodiments, the insulating layer 14 is made of silicon dioxide ($SiO_2$). In some embodiments, the insulating layer 14 is formed, for example, using a chemical vapor deposition (CVD) process. In some embodiments, the insulating layer 14 may be a spin-on glass (SOG) layer formed using a spin coating process.

In some embodiments, the contact plug 16 is disposed in the insulating layer 14. In some embodiments, the contact plug 16 is formed by steps including (1) providing a photoresist layer (not shown) on the insulating layer 14, (2) performing a photolithography process to define a pattern required to form a through-hole 144 in the insulating layer 14, (3) performing an etching process on the insulating layer 14 to produce the through-hole 144 by using the pattern in the photoresist layer as a mask, wherein the semiconductor component 12 is exposed to the through-hole 144, (4) depositing a conductive material into the through-hole 144, and (5) performing a planarizing process to remove the conductive material above the upper surface 142, such that a top surface 162 of the contact plug 16 is coplanar with the upper surface 142. In the resulting structure, the contact plug 16 penetrates through the insulating layer 14. In some embodiments, the contact plug 16 is physically and electrically connected to the semiconductor component 12. In some embodiments, the contact plug 16 is made of conductive material, including copper, a copper alloy, tungsten, or polysilicon.

Referring again to FIG. 5, in some embodiments, a blanket bottom electrode 181 is deposited on the insulating layer 14 and the contact plug 16 according to a step 304 in FIG. 4. In some embodiments, the blanket bottom electrode 181 is deposited, for example, using a CVD process. In some embodiments, the blanket bottom electrode 181 is made of conductive material, including titanium, tungsten, or the like.

Figure 6:
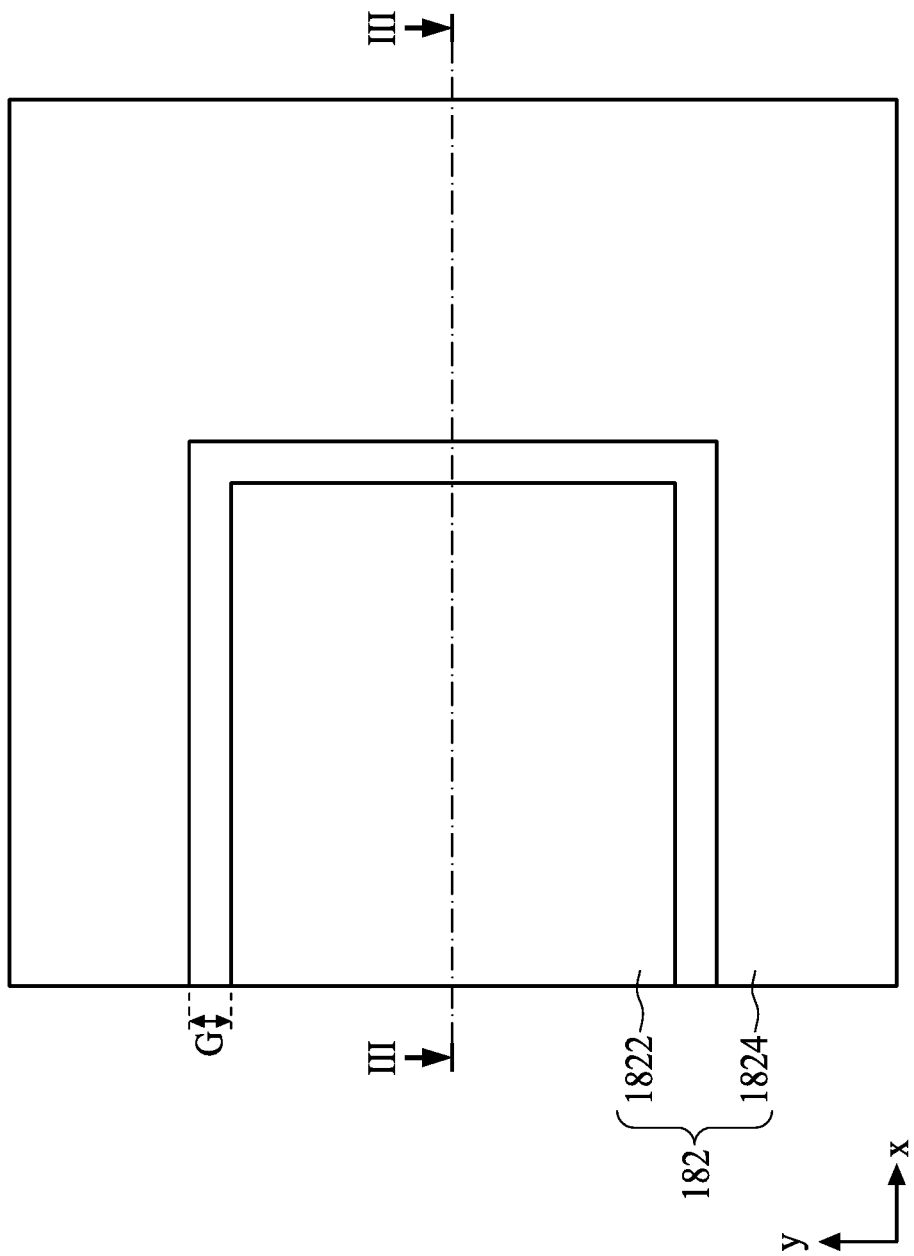
FIG. 6 is a top view of an intermediate stage in the manufacture of the electronic device in accordance with some embodiments of the present disclosure.
Figure 7:
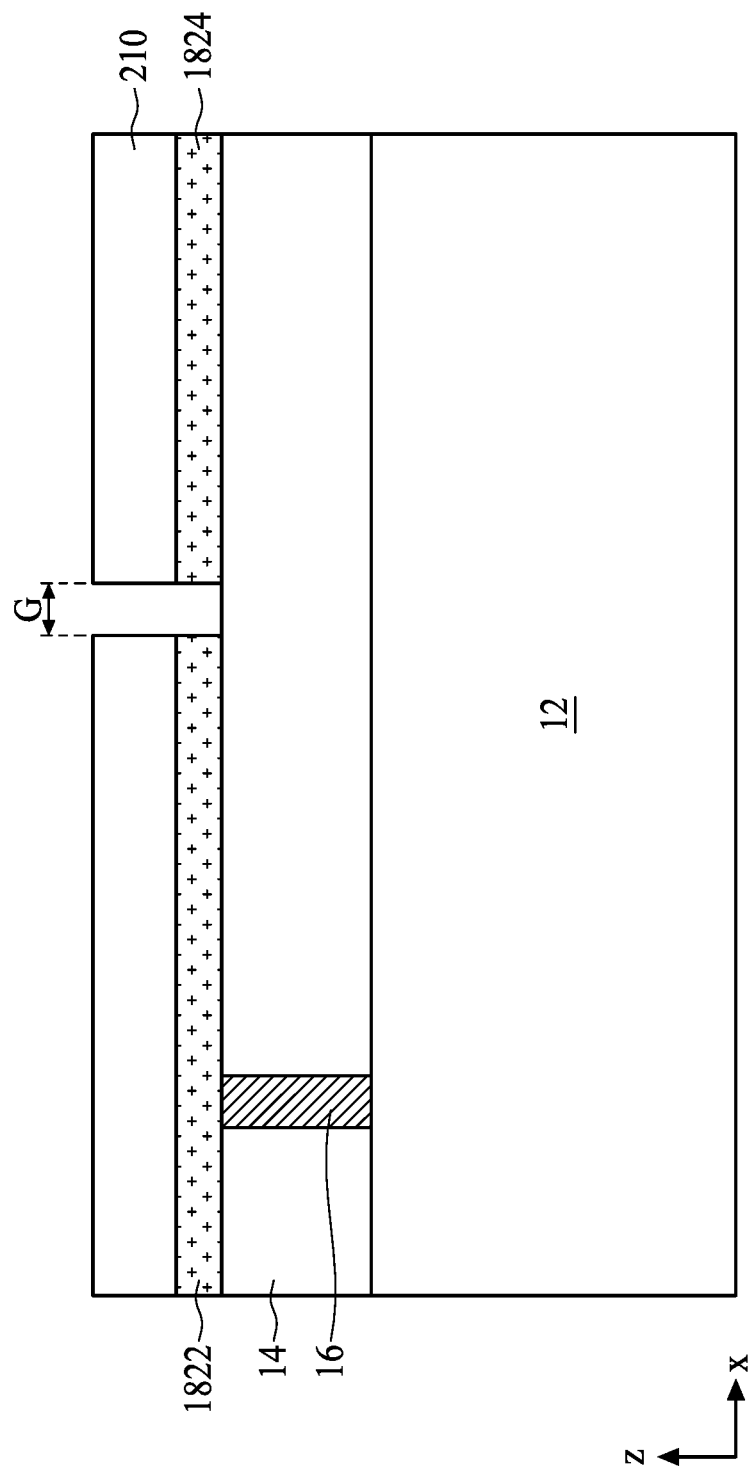
FIG. 7 is a cross-sectional view taken along the line illustrated in FIG. 6.

Next, a patterned mask 210 is provided on the blanket bottom electrode 181 to pattern the blanket bottom electrode 181 according to a step 306 in FIG. 4. In some embodiments, the patterned mask 210 has an opening 212 to expose a portion of the blanket bottom electrode 181. In some embodiments, a patterning process and an etching process are performed to remove a portion of the blanket bottom electrode 181 through the opening 212. Accordingly, the first segment 1822 and the second segment 1824 shown in FIGS. 6 and 7 are formed. In some embodiments, the first segment 1822 is separated from the second segment 1824 by a gap G. In some embodiments, the patterned mask 210 on the remaining bottom electrode 182 including the first segment 1822 and the second segment 1824 is then removed by, for example, a wet etching process.

Figure 8:
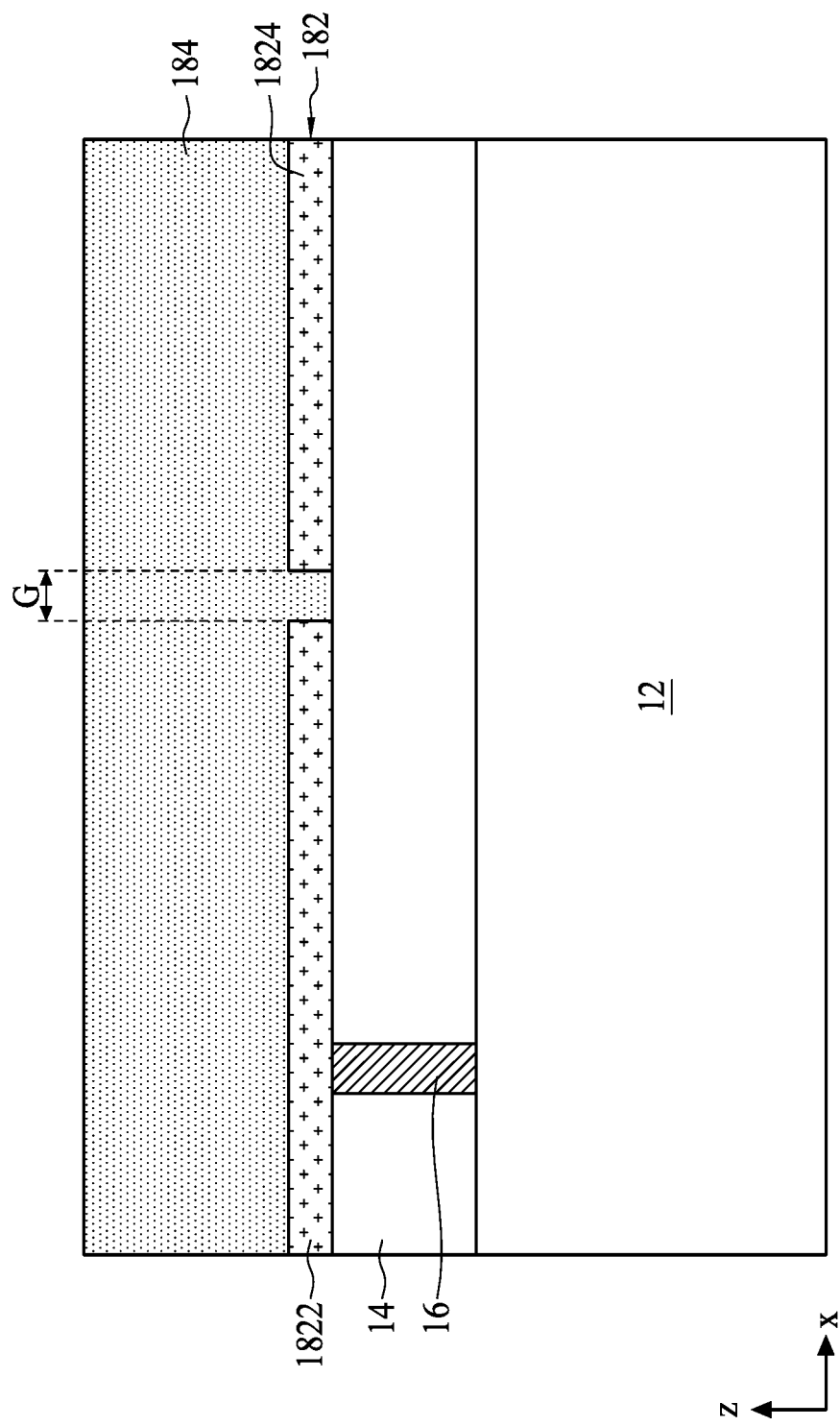
FIGS. 8 and 9 are cross-sectional views of intermediate stages in the manufacture of the electronic device in accordance with some embodiments of the present disclosure.

Referring to FIG. 8, in some embodiments, an isolation layer 184 is deposited on the bottom electrode 182 according to a step 308 in FIG. 4. In some embodiments, the isolation layer 184 extends along the first segment 1822 and the second segment 1824 and is disposed within the gap G. In some embodiments, the isolation layer 184 includes a high k material, hydrogen fluoride (HF), or zirconium oxide.

Figure 9:
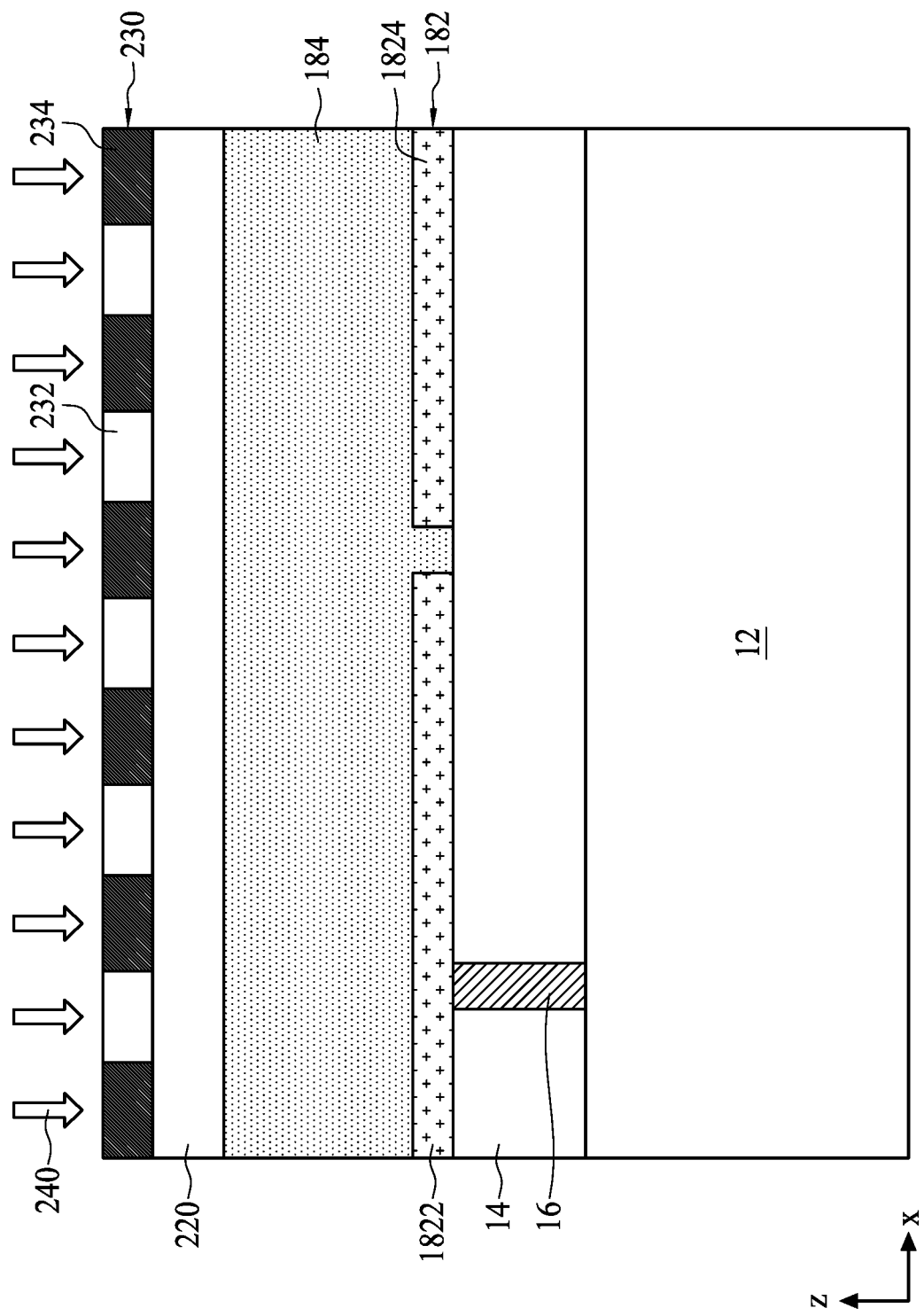

Referring to FIG. 9, in some embodiments, a first photoresist layer 220 is coated on the isolation layer 184 according to a step 310 in FIG. 4. In some embodiments, the first photoresist layer 220 is a positive photoresist layer. In some embodiments, a first mask 230 is further provided over the first photoresist layer 220. In some embodiments, the first mask 230 has a plurality of optical transparent regions 232 and a plurality of optical opaque regions 234 corresponding to portions of the first photoresist layer 220 to be removed and to remain, respectively, in a subsequent etching process.

Figure 10:
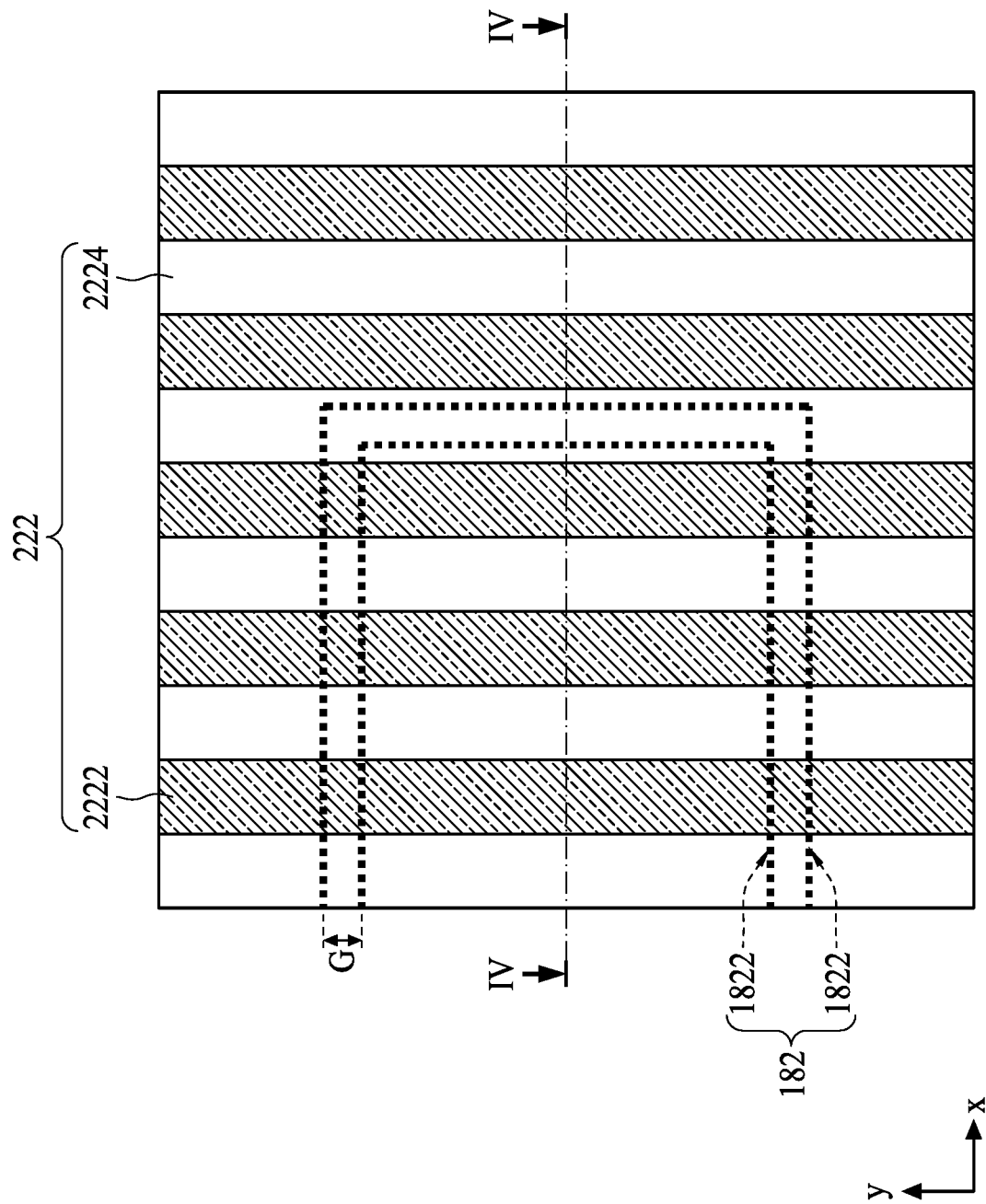
FIG. 10 is a top view of an intermediate stage in the manufacture of the electronic device in accordance with some embodiments of the present disclosure.
Figure 11:
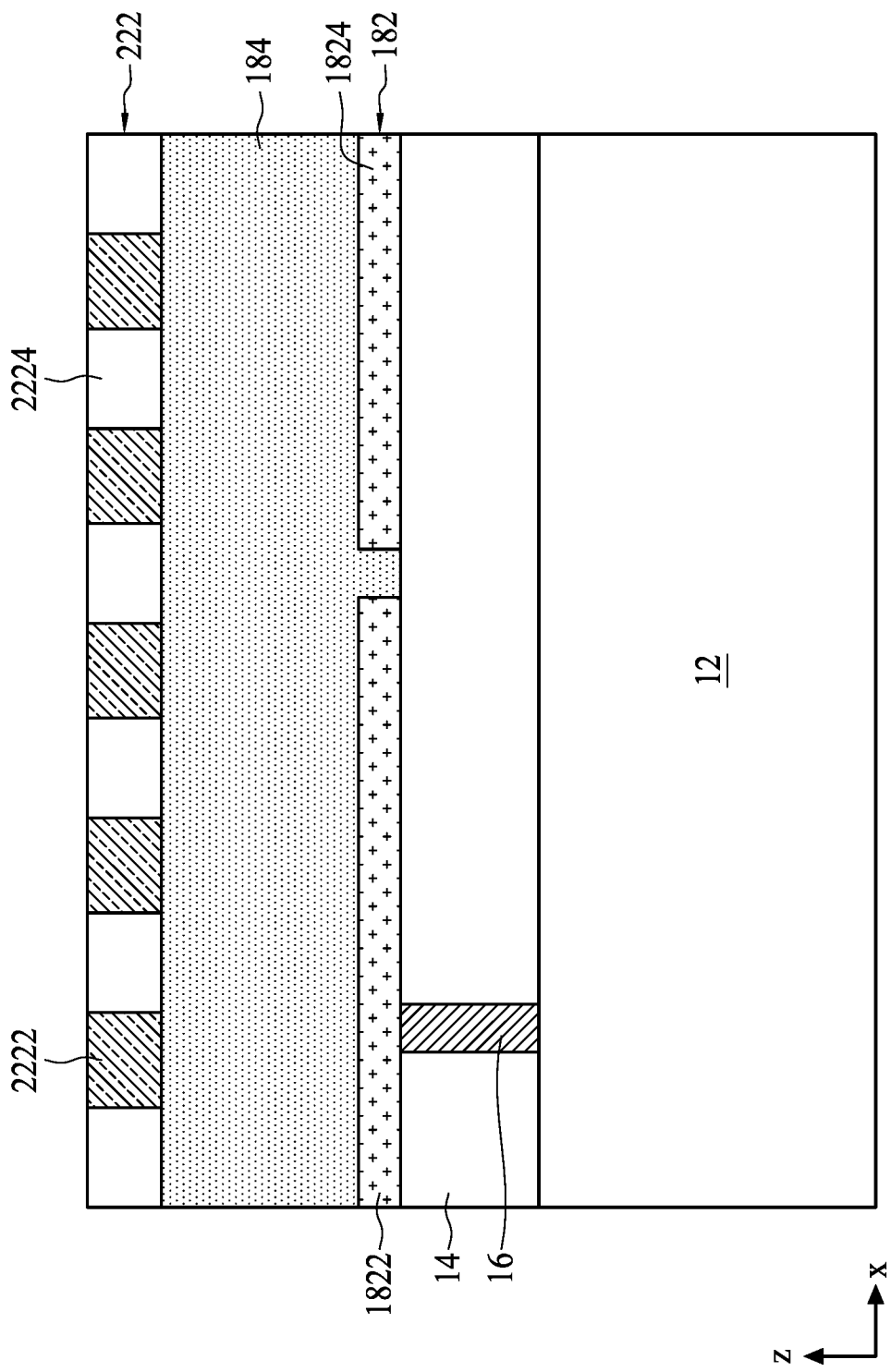
FIG. 11 is a cross-sectional view taken along the line IV-IV illustrated in FIG. 10.

Next, a first photolithography process is performed to expose the first photoresist layer 220 to actinic radiation 240 through the first mask 230 to provide a first photoresist pattern 222 according to a step 312 in FIG. 4. Referring to FIGS. 10 and 11, in some embodiments, the first photoresist pattern 222 is made up of a plurality of first exposed portions 2222 and a plurality of first unexposed portions 2224. In some embodiments, the first exposed portions 2222 and the first unexposed portions 2224 are alternatingly arranged along the first direction x. In some embodiments, the first mask 230 is then removed from the first photoresist pattern 222.

Figure 12:
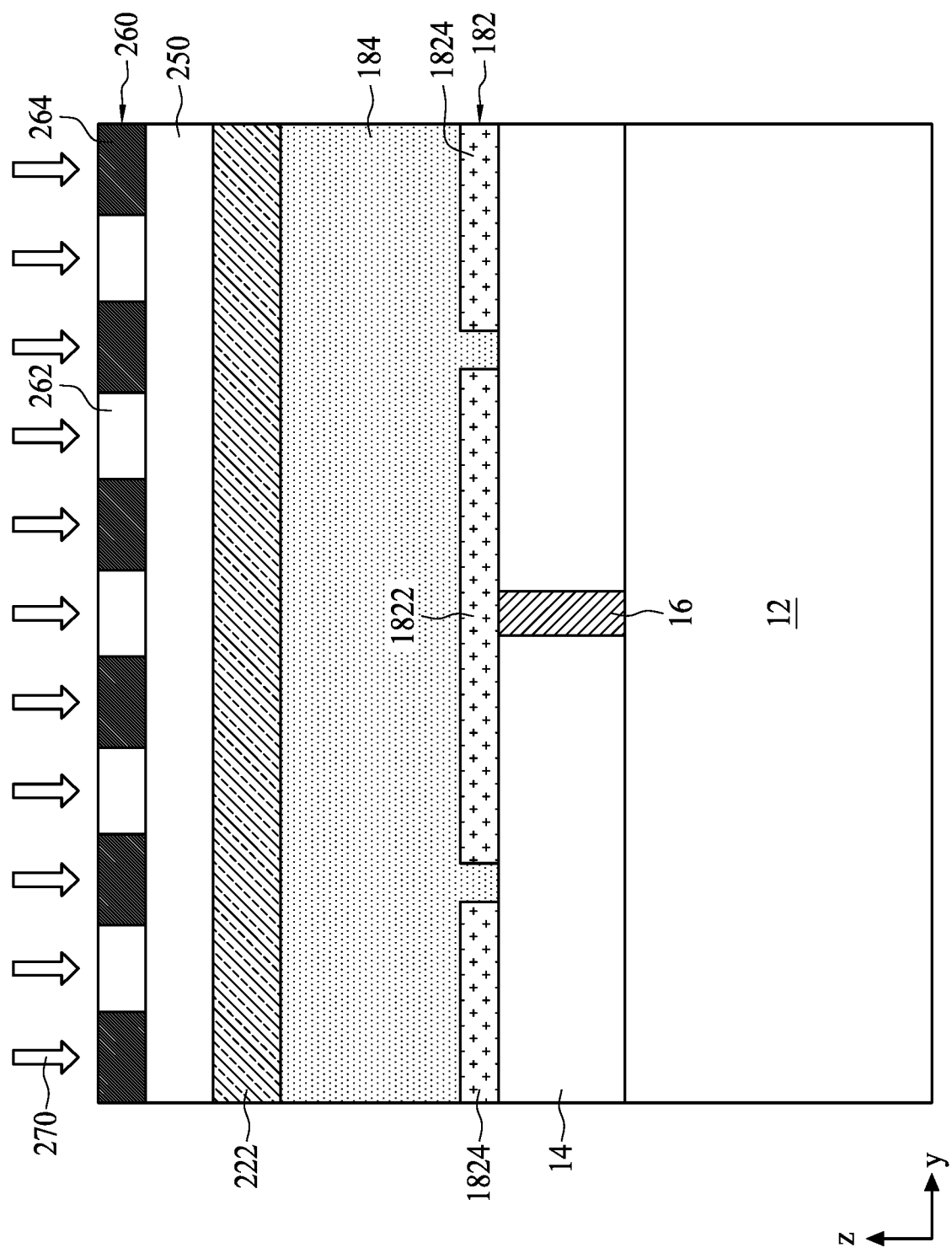
FIG. 12 is a cross-sectional view of an intermediate stage in the manufacture of the electronic device in accordance with some embodiments of the present disclosure.

Referring to FIG. 12, in some embodiments, a second photoresist layer 250 is coated on the first photoresist pattern 222 according to a step 314 in FIG. 4. In some embodiments, the second photoresist layer 250 is a positive photoresist layer. In some embodiments, a second mask 260 is further provided over the second photoresist layer 250. In some embodiments, the second mask 260 has a plurality of optical transparent portions 262 and a plurality of optical opaque regions 264 corresponding to portions of the second photoresist layer 250 to be removed and to remain, respectively, in the subsequent etching process. In some embodiments, the optical opaque regions 264 are disposed over the gap G to prevent the insulating layer 14 and the semiconductor component 12 from being destroyed during the subsequent etching process.

Figure 13:
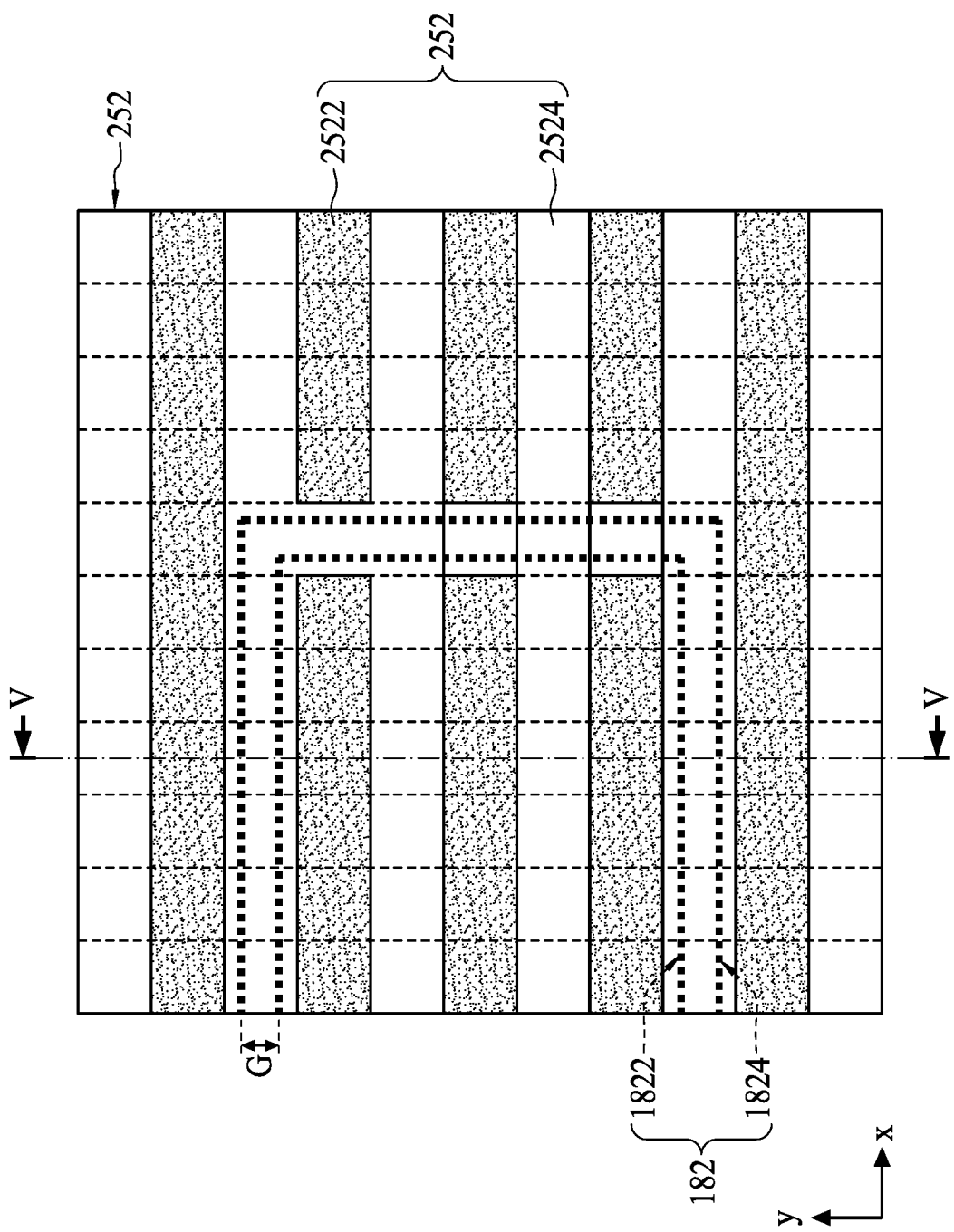
FIG. 13 is a top view of an intermediate stage in the manufacture of the electronic device in accordance with some embodiments of the present disclosure.
Figure 14:
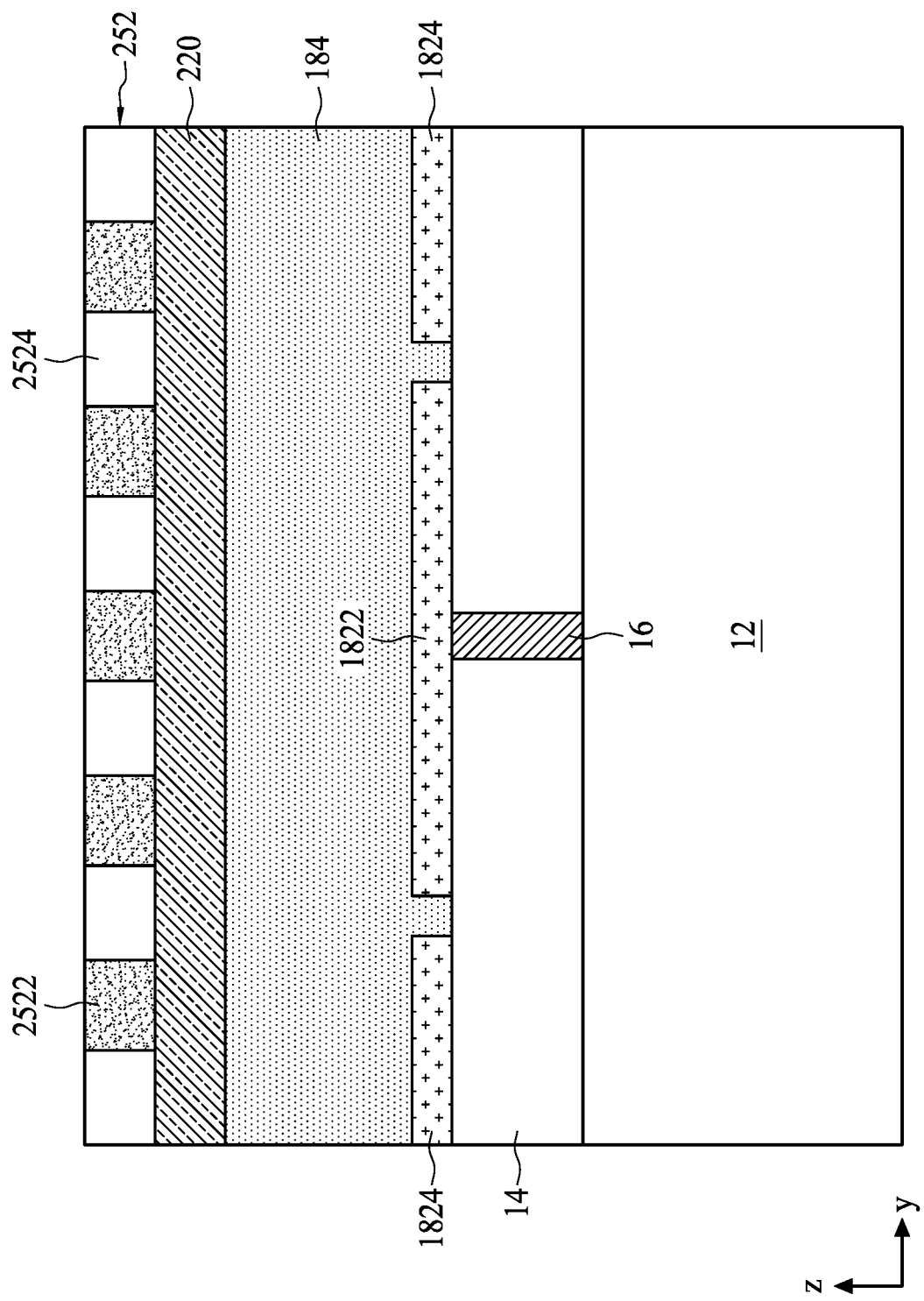
FIG. 14 is a cross-sectional view taken along the line V-V illustrated in FIG. 13.

Next, a second photolithography process is performed to expose the second photoresist layer 250 to actinic radiation 270 through the second mask 260 to provide a second photoresist pattern 252 according to a step 316 in FIG. 4. Referring to FIGS. 13 and 14, in some embodiments, the second photoresist pattern 252 is made up of a plurality of second exposed portions 2522 and a plurality of second unexposed portions 2524. In some embodiments, the second exposed portions 2522 and the second unexposed portions 2524 are alternatingly arranged along a second direction y perpendicular to the first direction x. In some embodiments, the second mask 260 is then removed from the second photoresist pattern 252.

Figure 15:
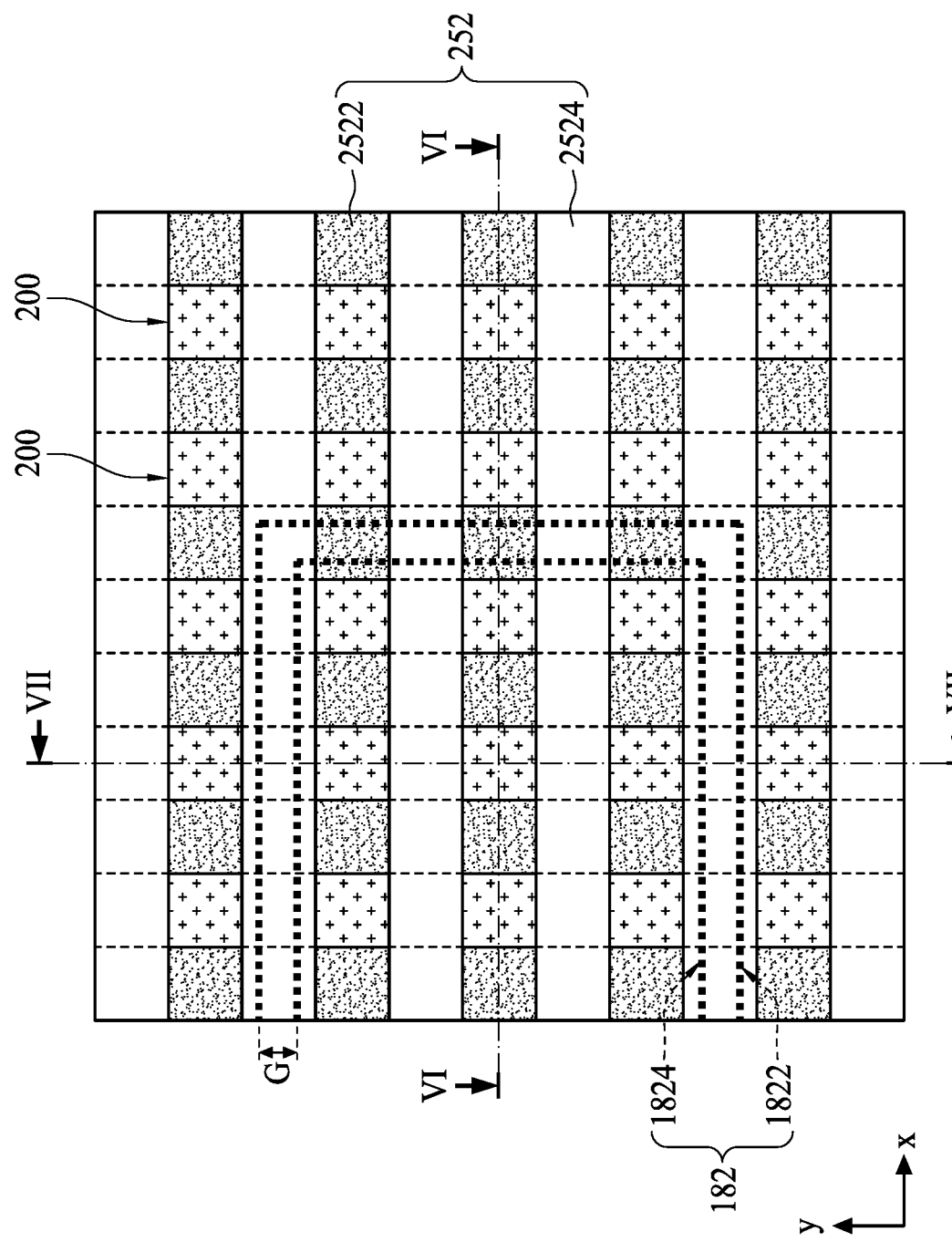
FIG. 15 is a top view of an intermediate stage in the manufacture of the electronic device in accordance with some embodiments of the present disclosure.
Figure 16:
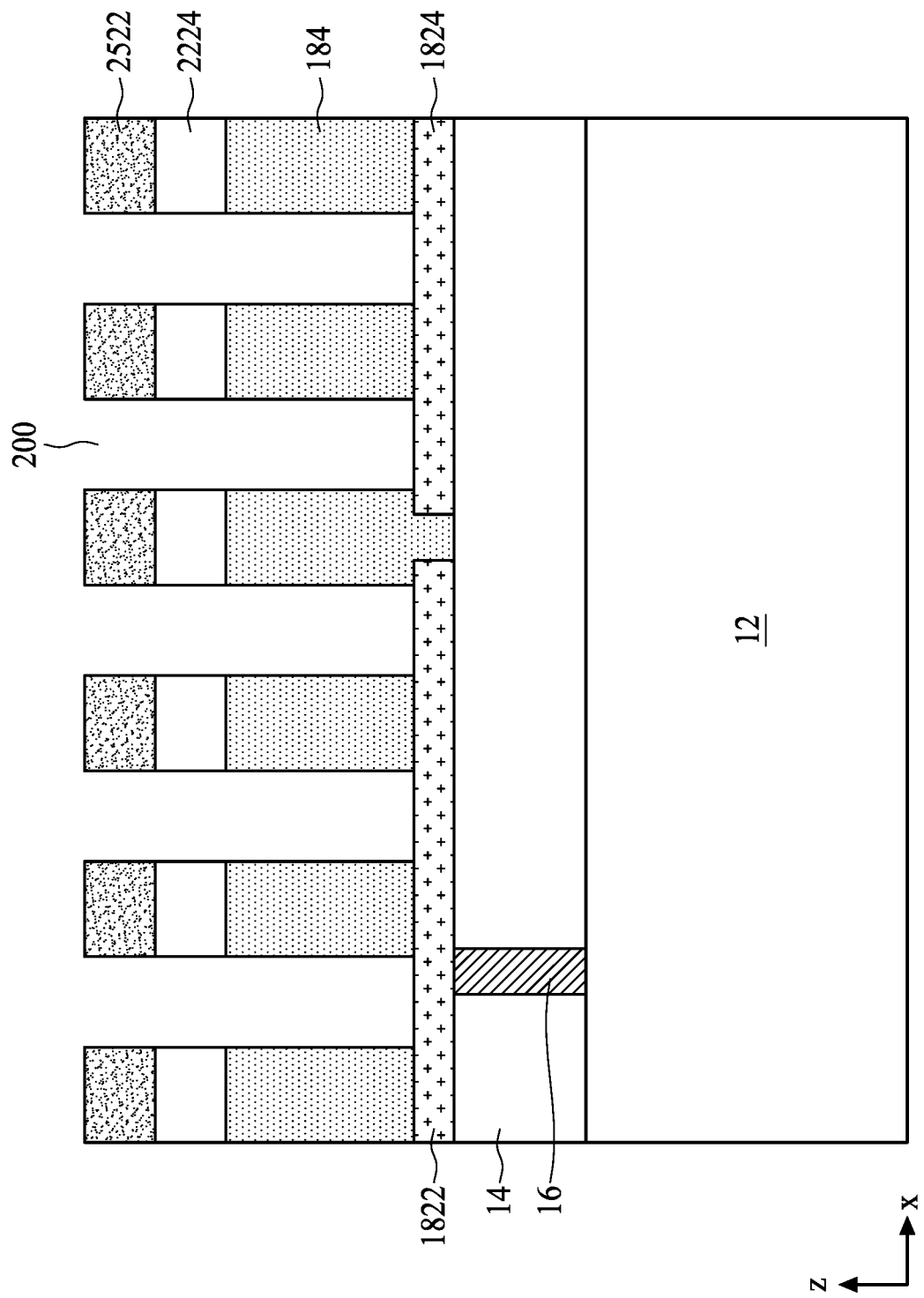
FIG. 16 is a cross-sectional view taken along the line VI-VI illustrated in FIG. 15.
Figure 17:
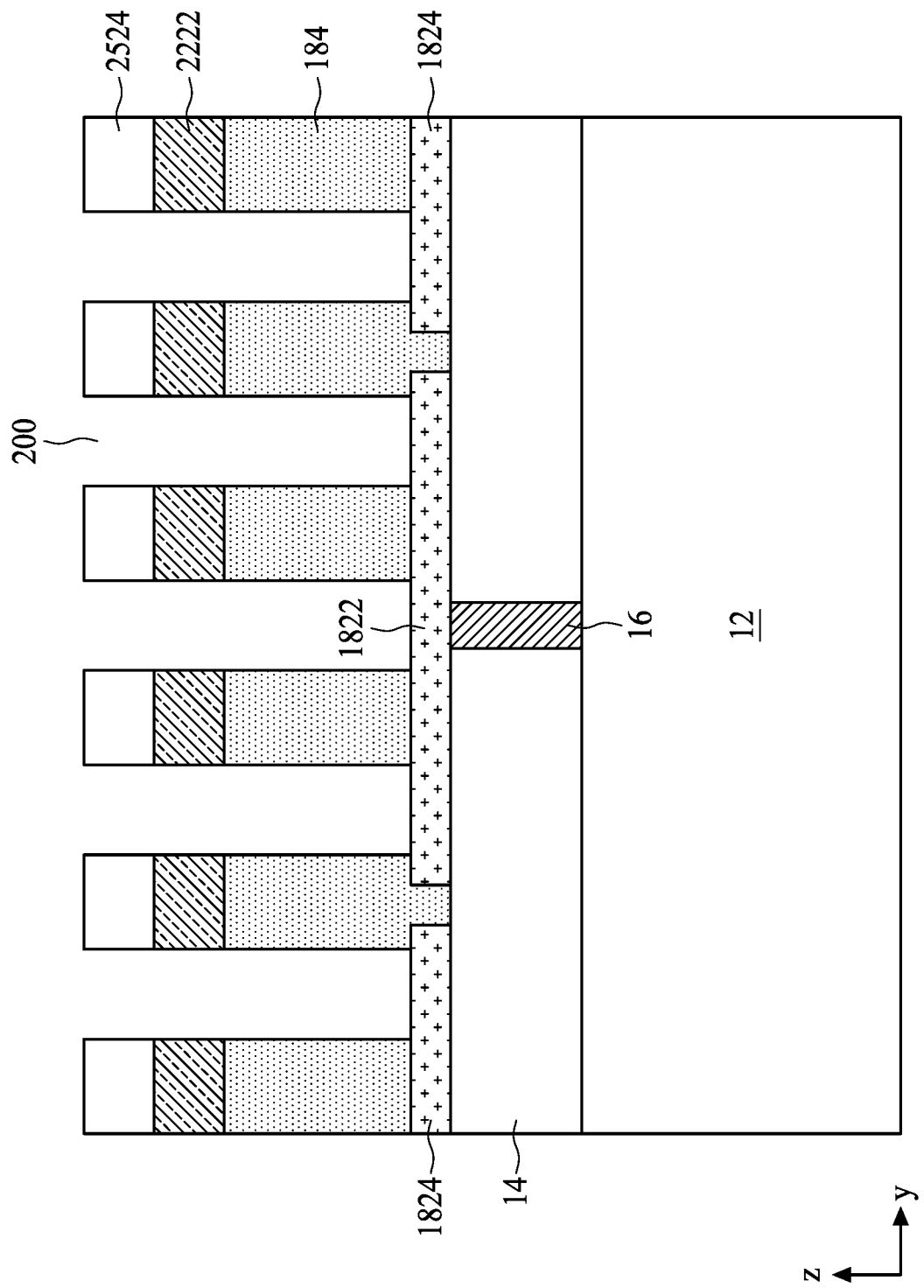
FIG. 17 is a cross-sectional view taken along the line VII-VII illustrated in FIG. 15.
Figure 18:
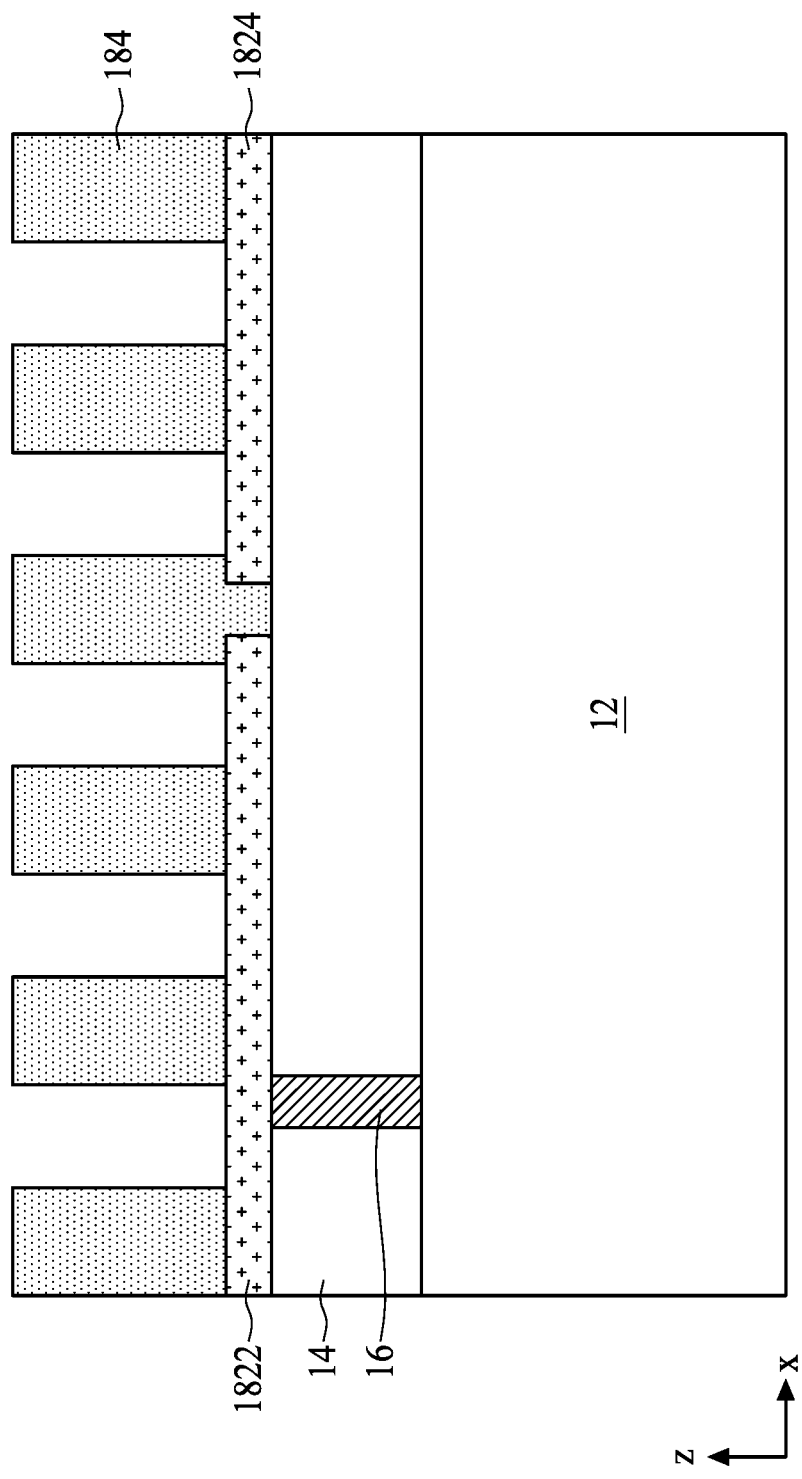
FIGS. 18 through 20 are cross-sectional views of intermediate stages in the manufacture of the electronic device in accordance with some embodiments of the present disclosure.

Referring to FIGS. 15 through 17, in some embodiments, an etching process is performed to form a plurality of trenches 200 in the isolation layer 184 according to a step 318 in FIG. 4. In some embodiments, the etching process is used to remove the first exposed portions 2222, the second exposed portions 2522, and portions of the isolation layer 184 at intersections wherein the first exposed portions 2222 and the second exposed portions 2522 intersect, such that the trenches 200 are formed. In some embodiments, the etching process stops at the bottom electrode 182. Referring to FIG. 18, in some embodiments, an ashing process or a wet strip process may be used to remove the first unexposed portions 2224 and the second unexposed portions 2524.

Figure 19:
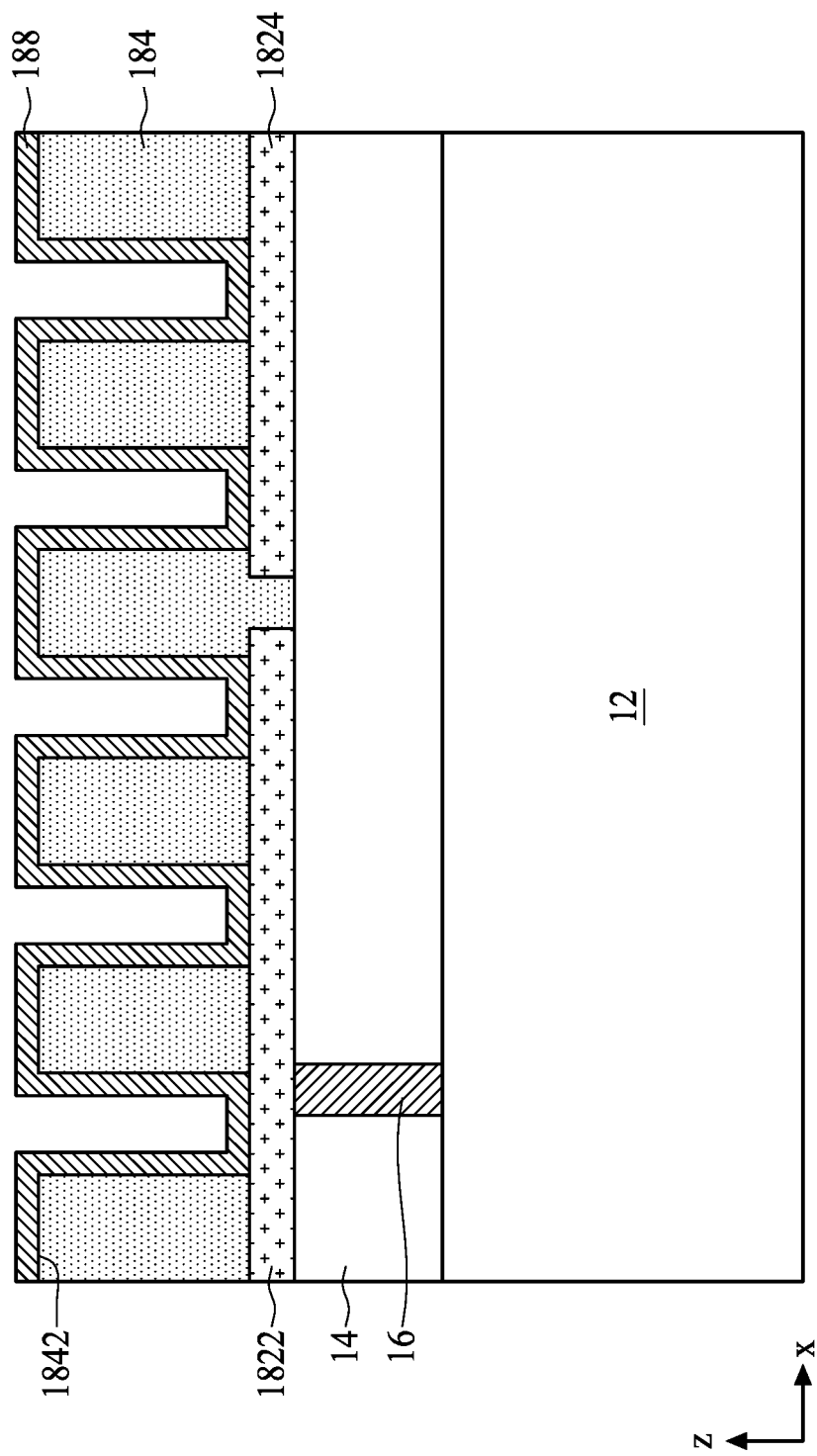

Referring to FIG. 19, in some embodiments, a dielectric layer 188 is deposited on the isolation layer 184 and in the trenches 200 according to a step 320 in FIG. 4. In some embodiments, the dielectric layer 188 extends along a top surface 1842 of the isolation layer 184 and into the trenches 200. In some embodiments, the dielectric layer 188 includes oxide. In some embodiments, the dielectric layer 188 may be formed using a CVD process.

Figure 20:
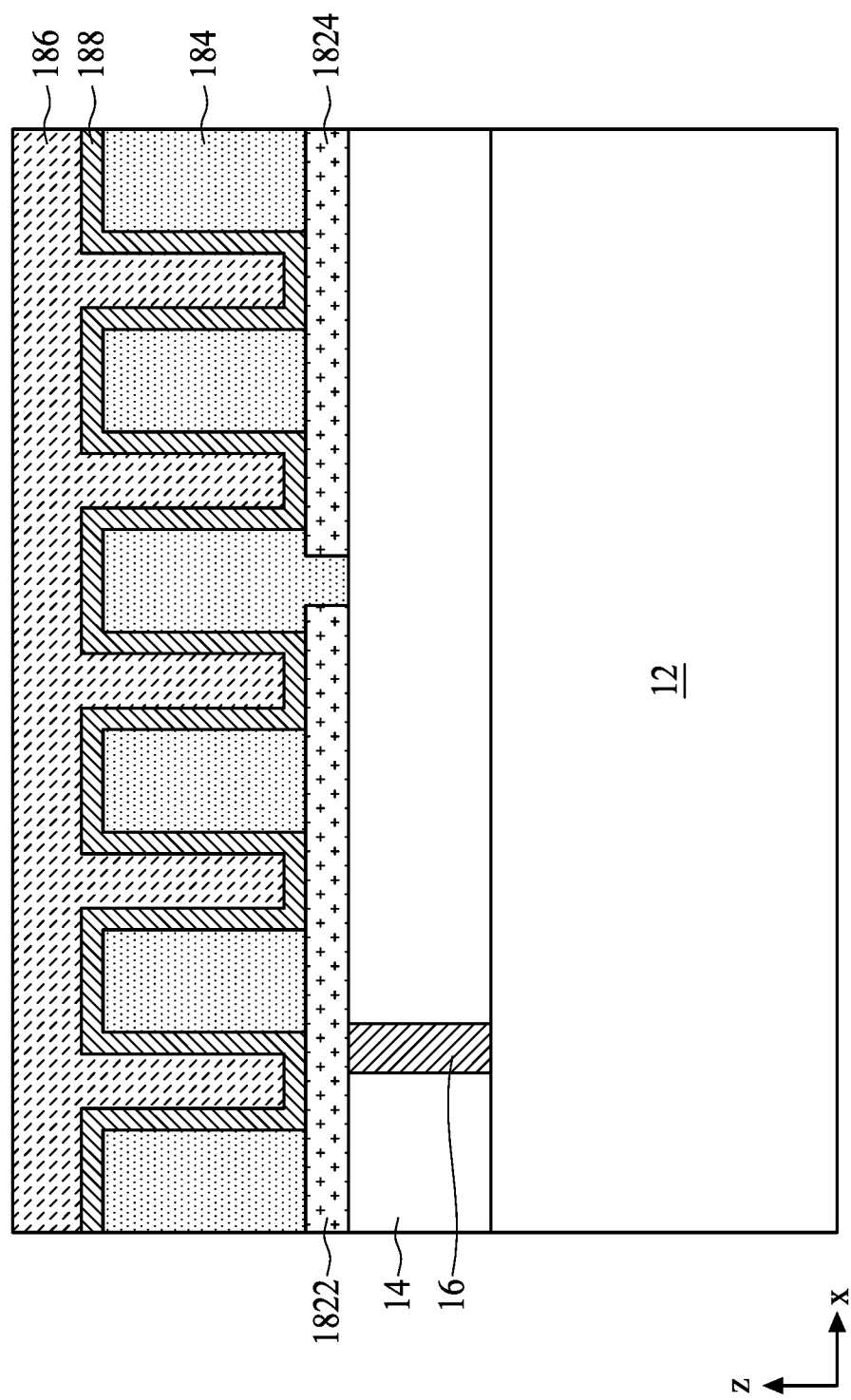

Referring to FIG. 20, a top electrode 186 is deposited on the dielectric layer 188 according to a step 322 in FIG. 4. Accordingly, the electronic device 10 is completely formed. In some embodiments, the top electrode 186 fully covers the dielectric layer 188. In some embodiments, the top electrode 186 includes copper or a copper alloy, although other types of conductive materials, including aluminum, silver, gold, tungsten, or a combination thereof, may also be used. In some embodiments, the formation methods of the top electrode 186 include a plating process (such as an electroplating process), a CVD process, a physical vapor deposition (PVD) process or a sputtering process.

Figure 21:
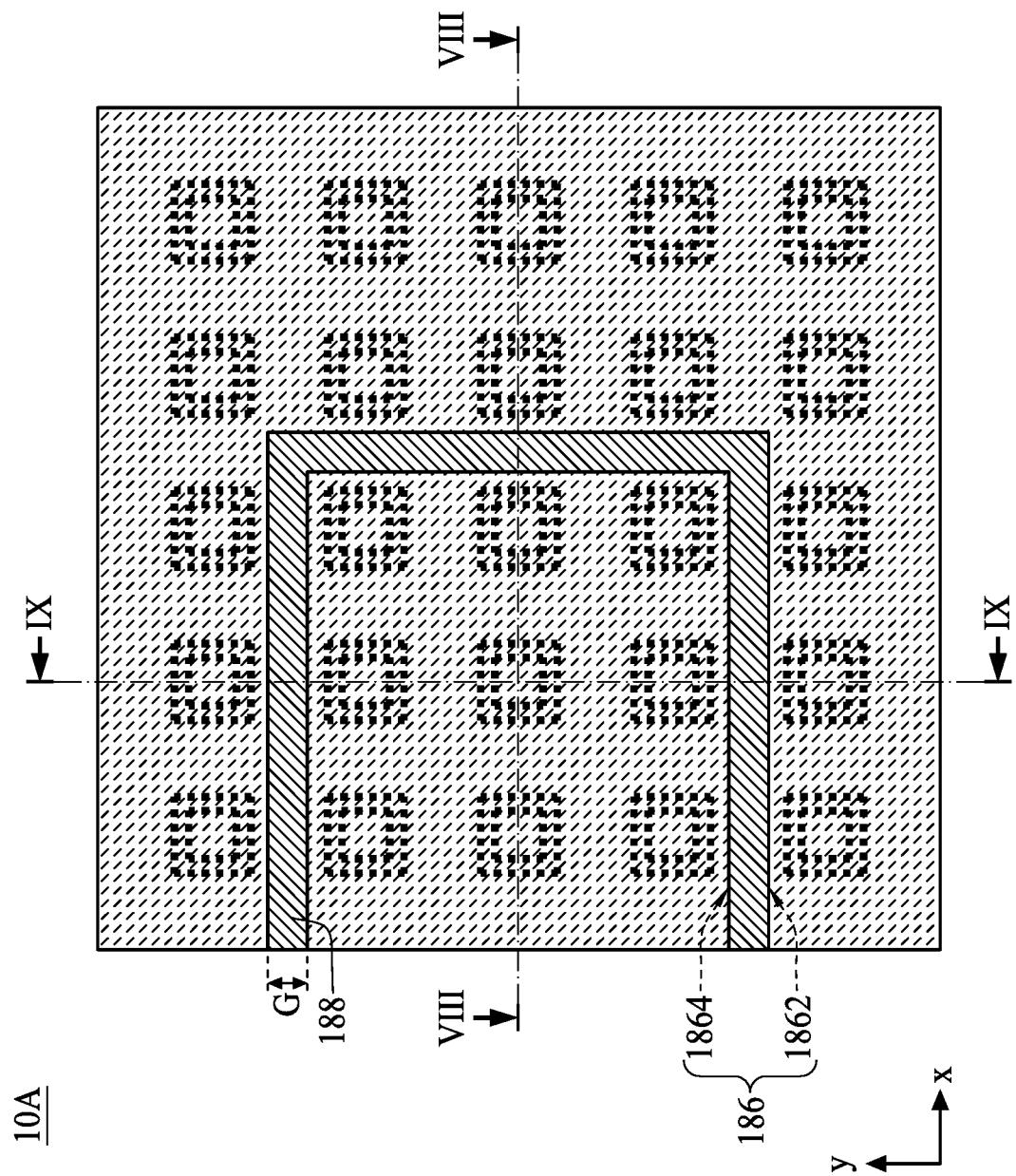
FIG. 21 is a top view of an electronic device in accordance with some embodiments of the present disclosure.
Figure 22:
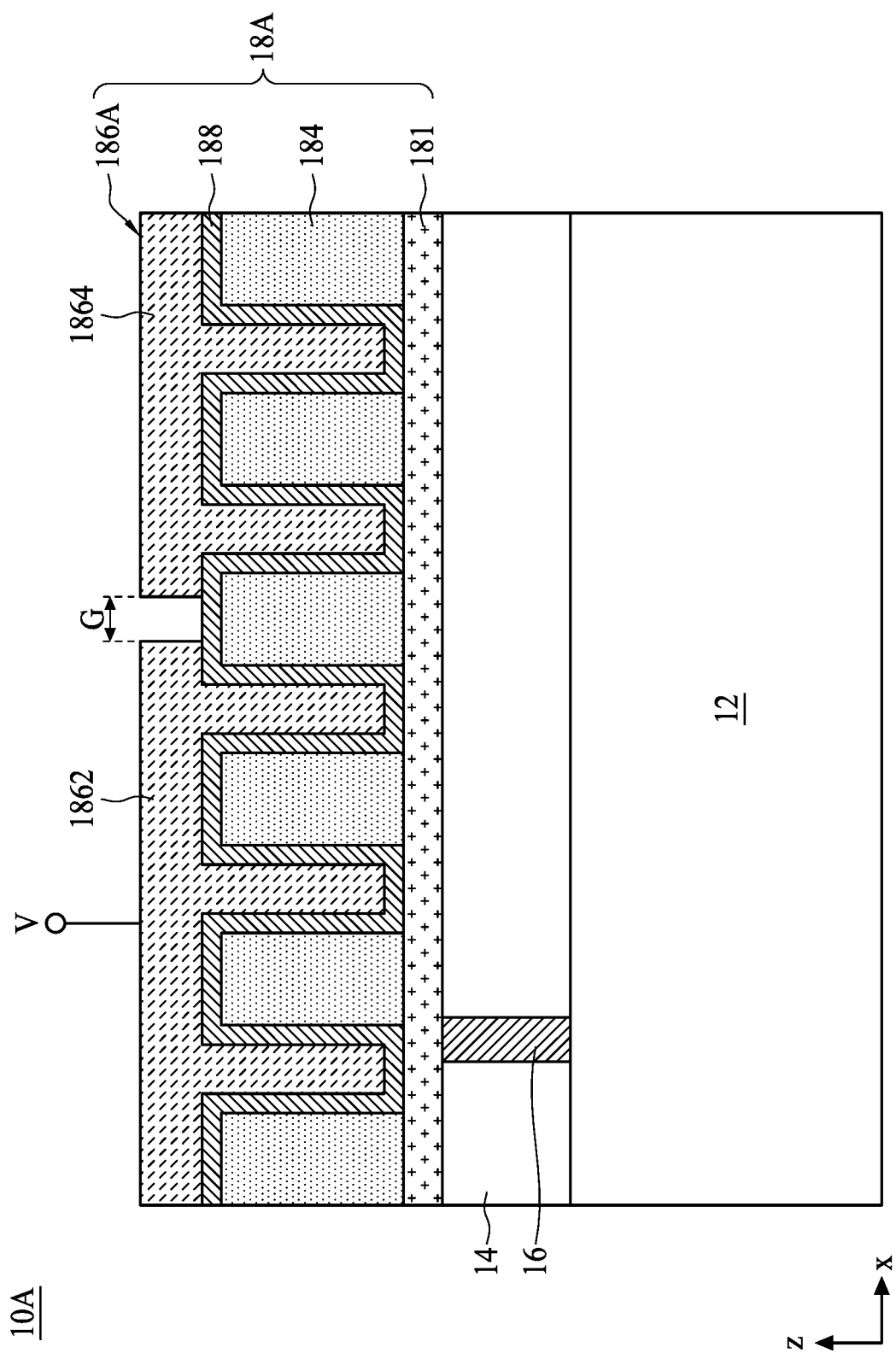
FIG. 22 is a cross-sectional view taken along the line VIII-VIII illustrated in FIG. 21.
Figure 23:
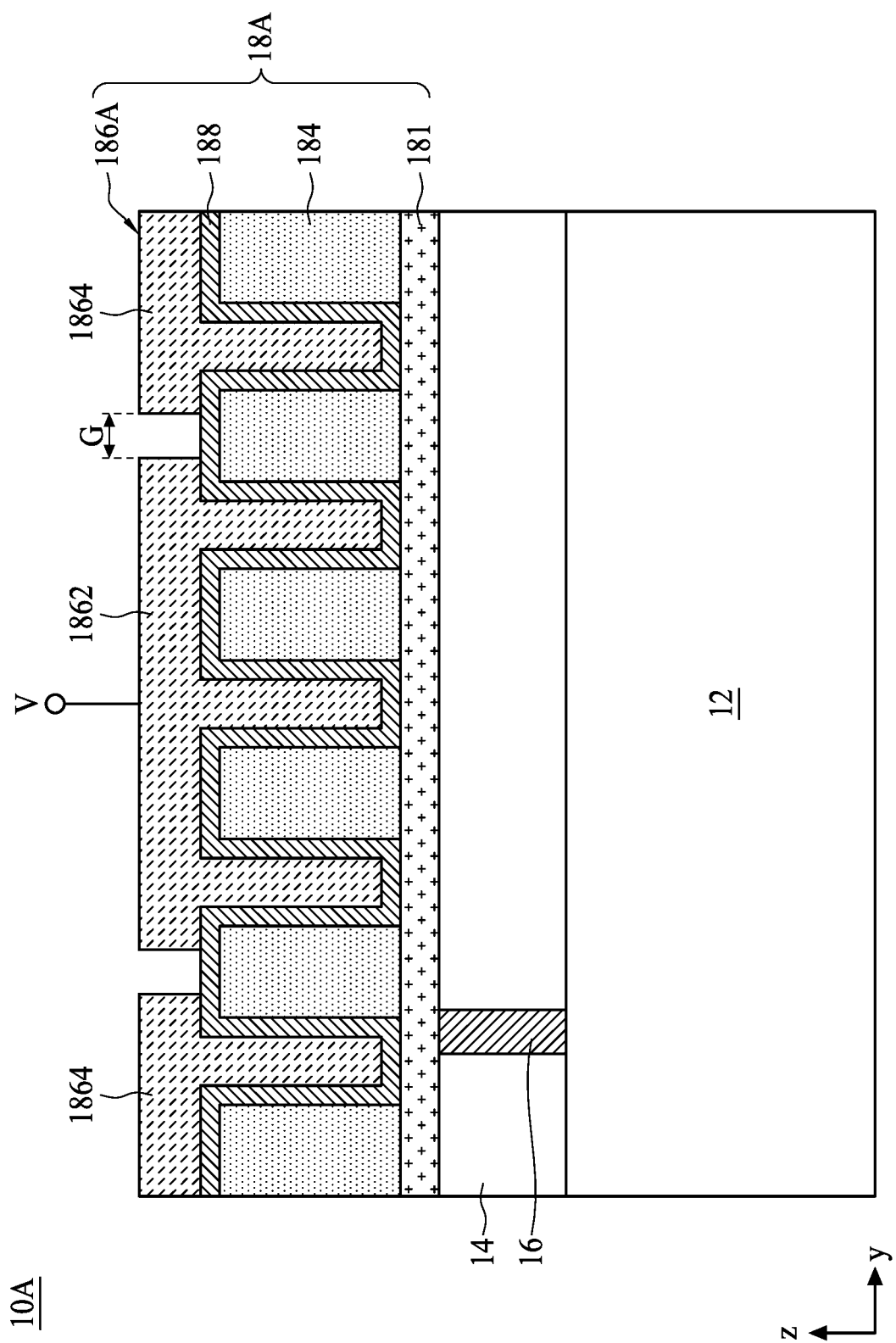
FIG. 23 is a cross-sectional view taken along the line IX-IX illustrated in FIG. 21.

FIG. 21 is a top view of an electronic device 10A in accordance with some embodiments of the present disclosure, FIG. 22 is a cross-sectional view taken along the line VIII-VIII illustrated in FIG. 21, and FIG. 23 is a cross-sectional view taken along the line IX-IX illustrated in FIG. 21. Referring to FIGS. 21 and 23, the electronic device 10A includes a semiconductor component 12, an insulating layer 14 disposed on the semiconductor component 12, at least one contact plug 16 penetrating through the insulating layer 14, and a filtering component 18A disposed on the insulating layer 14 and the contact plug 16. In some embodiments, the filtering component 18A is electrically coupled to the semiconductor component 12 through the contact plug 16.

In some embodiments, the filtering component 18A includes a blanket bottom electrode 181, an isolation layer 184 disposed on the blanket bottom electrode 181, a top electrode 186A, extending along a top surface 1842 of the isolation layer 184 and disposed within the isolation layer 184, wherein the top electrode 186A is divided into a first segment 1862 and a second segment 1864 separated from each other, and a dielectric layer 188 is disposed between the blanket bottom electrode 181 and the top electrode 186A.

In some embodiments, the blanket bottom electrode 181 is connected to the contact plug 16. In some embodiments, a gap G is formed between the first segment 1862 and the second segment 1864. In some embodiments, the first segment 1862 is surrounded by the second segment 1864. In some embodiments, the first segment 1862 has a footprint smaller than that of the second segment 1864.

In some embodiments, the dielectric layer 188 extends along the top surface 1842 of the isolation layer 184 and into the isolation layer 184 to encircle the top electrode 186. In some embodiments, the dielectric layer 188 is a conformal layer. In some embodiments, the dielectric layer 188 is sandwiched between the bottom electrode 182 and the top electrode 186, such that when a power source V is applied across the semiconductor component 12 and the filtering component 18, the blanket bottom electrode 181, the first segment 1862 of the top electrode 186, and the dielectric layer 188 collectively form at least one decoupling capacitor for noise mitigation in a high frequency application of the electronic device 10A. In some embodiments, the bottom electrode 182, the second segment 1864 of the top electrode 186, and the dielectric layer 188 collectively form at least one dummy capacitor for preventing the decoupling capacitor from collapse due to the power source V not being applied to the second segment 1824.

Figure 24:
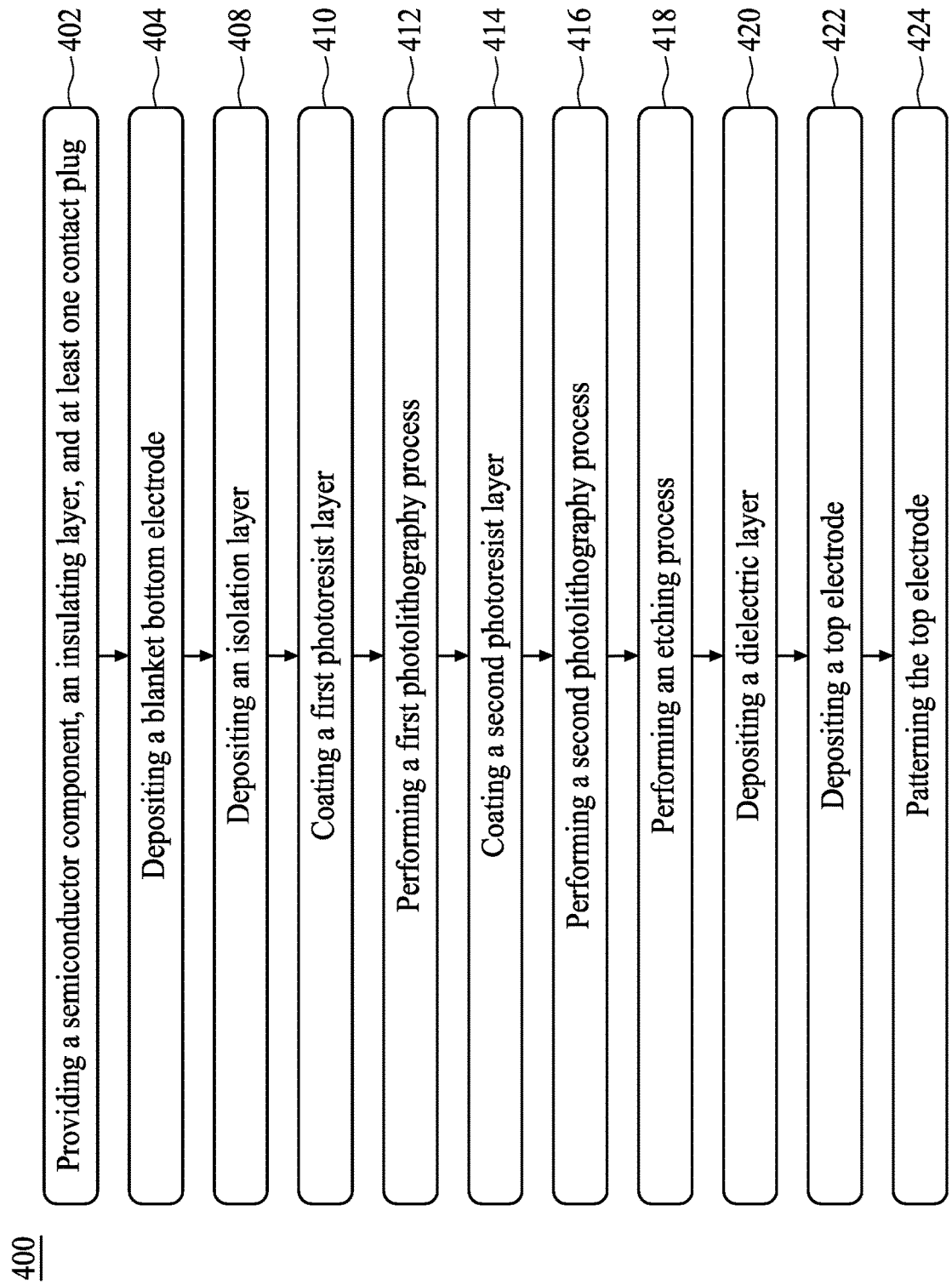
FIG. 24 is a flow diagram illustrating a method of manufacturing an electronic device in accordance with some embodiments of the present disclosure.

FIG. 24 is a flow diagram illustrating a method 400 for manufacturing an electronic device 10A in accordance with some embodiments of the present disclosure. FIGS. 25 to 36 are schematic diagrams illustrating various fabrication stages constructed according to the method 400 for manufacturing the electronic device 10 in accordance with some embodiments of the present disclosure. The stages shown in FIGS. 25 to 36 are also illustrated schematically in the process flow in FIG. 24. In the following discussion, the fabrication stages shown in FIGS. 25 to 36 are discussed in reference to the process steps in FIG. 24.

Figure 25:
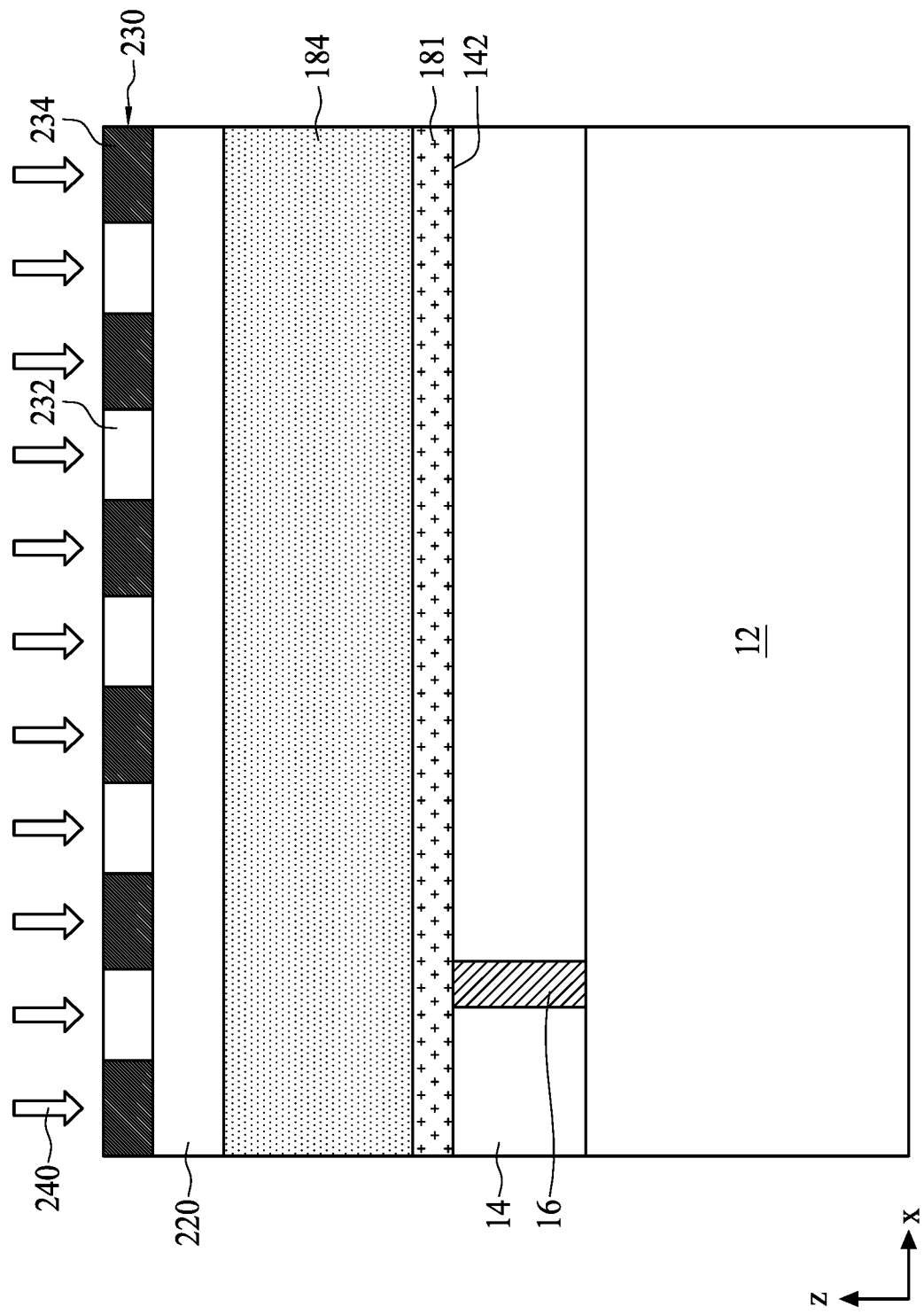
FIG. 25 is a cross-sectional view of an intermediate stage in the manufacture of the electronic device in accordance with some embodiments of the present disclosure.
Figure 26:
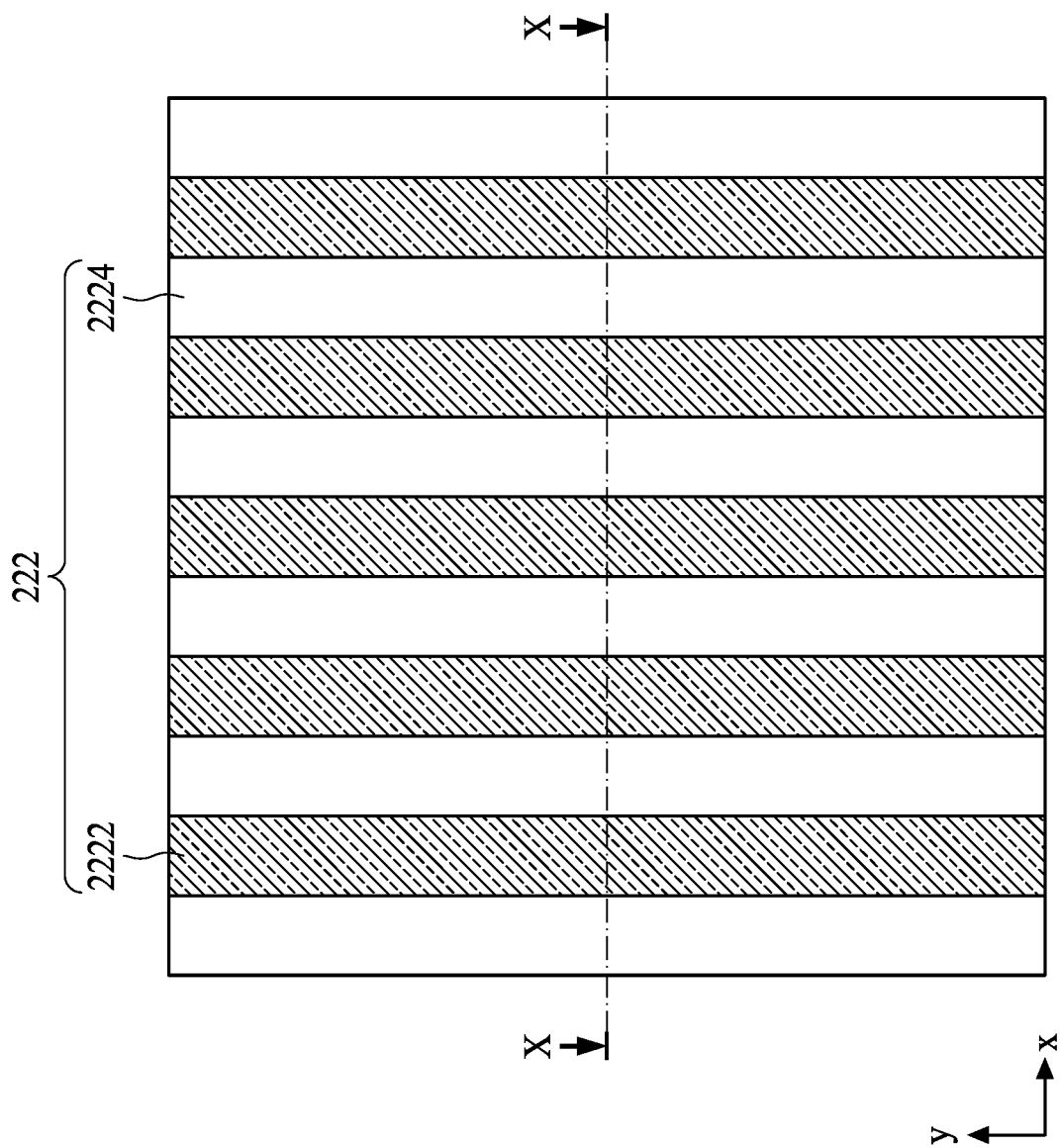
FIG. 26 is a top view of an intermediate stage in the manufacture of the electronic device in accordance with some embodiments of the present disclosure.
Figure 27:
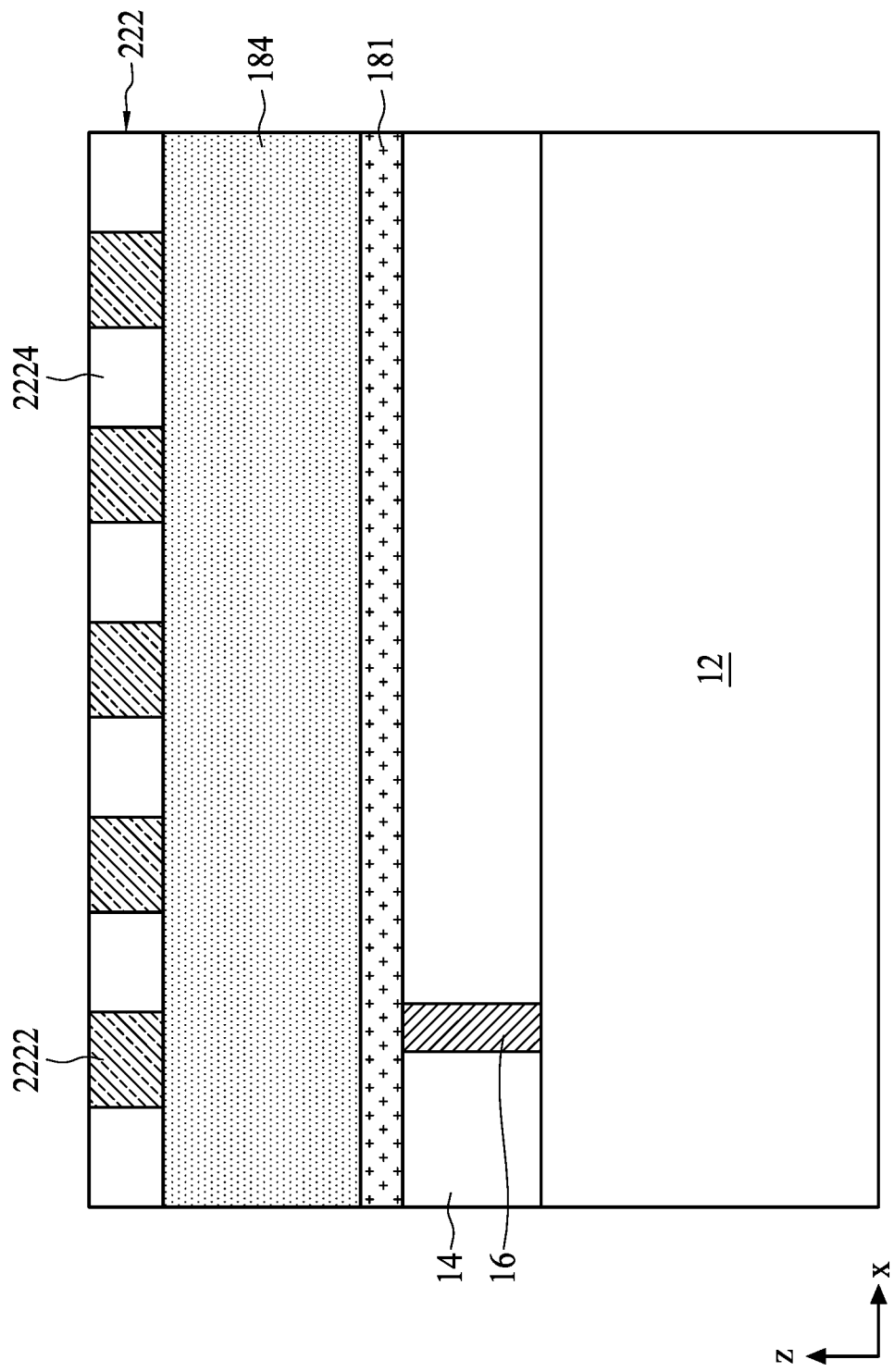
FIG. 27 is a cross-sectional view taken along the line X-X illustrated in FIG. 26.

Referring to FIG. 25, a semiconductor component 12, an insulating layer 14, and at least one contact plug 16 are provided according to a step 402 in FIG. 24. In some embodiments, the insulating layer 14 with a flat upper surface 142 is formed on the semiconductor component 12, and the contact plug 16 is disposed penetrating through the insulating layer 14.

Next, a blanket bottom electrode 181 is deposited on the insulating layer 14 and the contact plug 16 according to a step 404 in FIG. 24. In some embodiments, the blanket bottom electrode 181 is connected to the contact plug 16. In some embodiments, the blanket bottom electrode 181 is deposited, for example, using a CVD process. In some embodiments, an isolation layer 184 is then deposited on the blanket bottom electrode 181 according to a step 408 in FIG. 24. In some embodiments, the isolation layer 184 includes a high k material, hydrogen fluoride, or zirconium oxide.

Referring again to FIG. 25, in some embodiments, a first photoresist layer 220 is then coated on the isolation layer 184 according to a step 410 in FIG. 24. In some embodiments, the first photoresist layer 220 is a positive photoresist layer. In some embodiments, a first mask 230 is further provided over the first photoresist layer 220. In some embodiments, the first mask 230 has a plurality of optical transparent regions 232 and a plurality of optical opaque regions 234 corresponding to portions of the first photoresist layer 220 to be removed and to remain, respectively, in a subsequent etching process. Next, a first photolithography process is performed to expose the first photoresist layer 220 to actinic radiation 240 through the first mask 230 according to a step 412 in FIG. 24. Accordingly, a first photoresist pattern 222 made up of a plurality of first exposed portions 2222 and a plurality of first unexposed portions 2224 are formed, as shown FIGS. 26 and 27. In some embodiments, the first exposed portions 2222 and the first unexposed portions 2224 are alternatingly arranged along a first direction x. In some embodiments, the first mask 230 is then removed from the first photoresist pattern 222.

Figure 28:
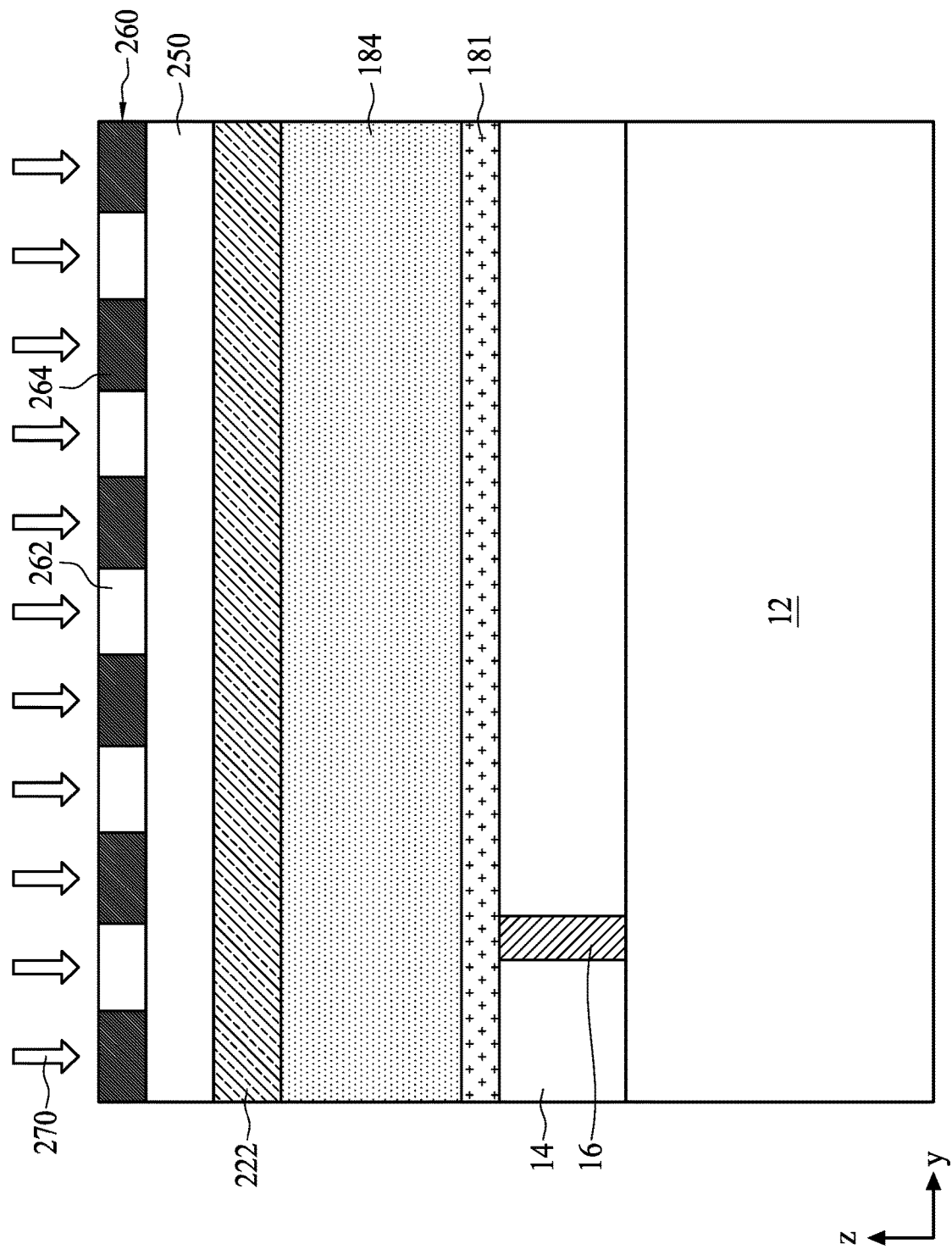
FIG. 28 is a cross-sectional view of an intermediate stage in the manufacture of the electronic device in accordance with some embodiments of the present disclosure.

Referring to FIG. 28, in some embodiments, a second photoresist layer 250 is coated on the first photoresist pattern 222 according to a step 414 in FIG. 24. In some embodiments, the second photoresist layer 250 is a positive photoresist layer. In some embodiments, a second mask 260 is further provided over the second photoresist layer 250. In some embodiments, the second mask 260 has a plurality of optical transparent portions 262 and a plurality of optical opaque regions 264 corresponding to portions of the second photoresist layer 250 to be removed and to remain, respectively, in the subsequent etching process.

Figure 29:
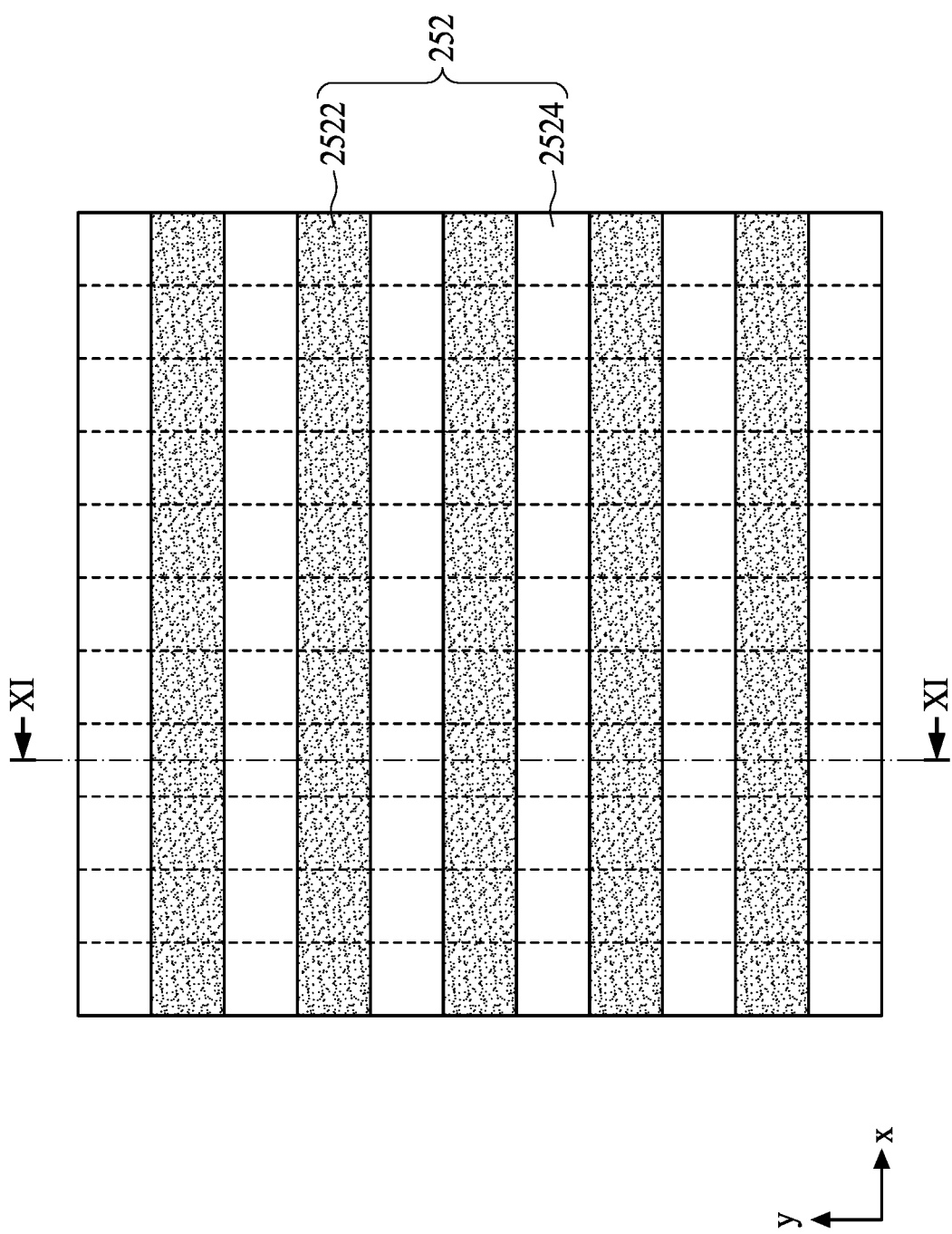
FIG. 29 is a top view of an intermediate stage in the manufacture of the electronic device in accordance with some embodiments of the present disclosure.
Figure 30:
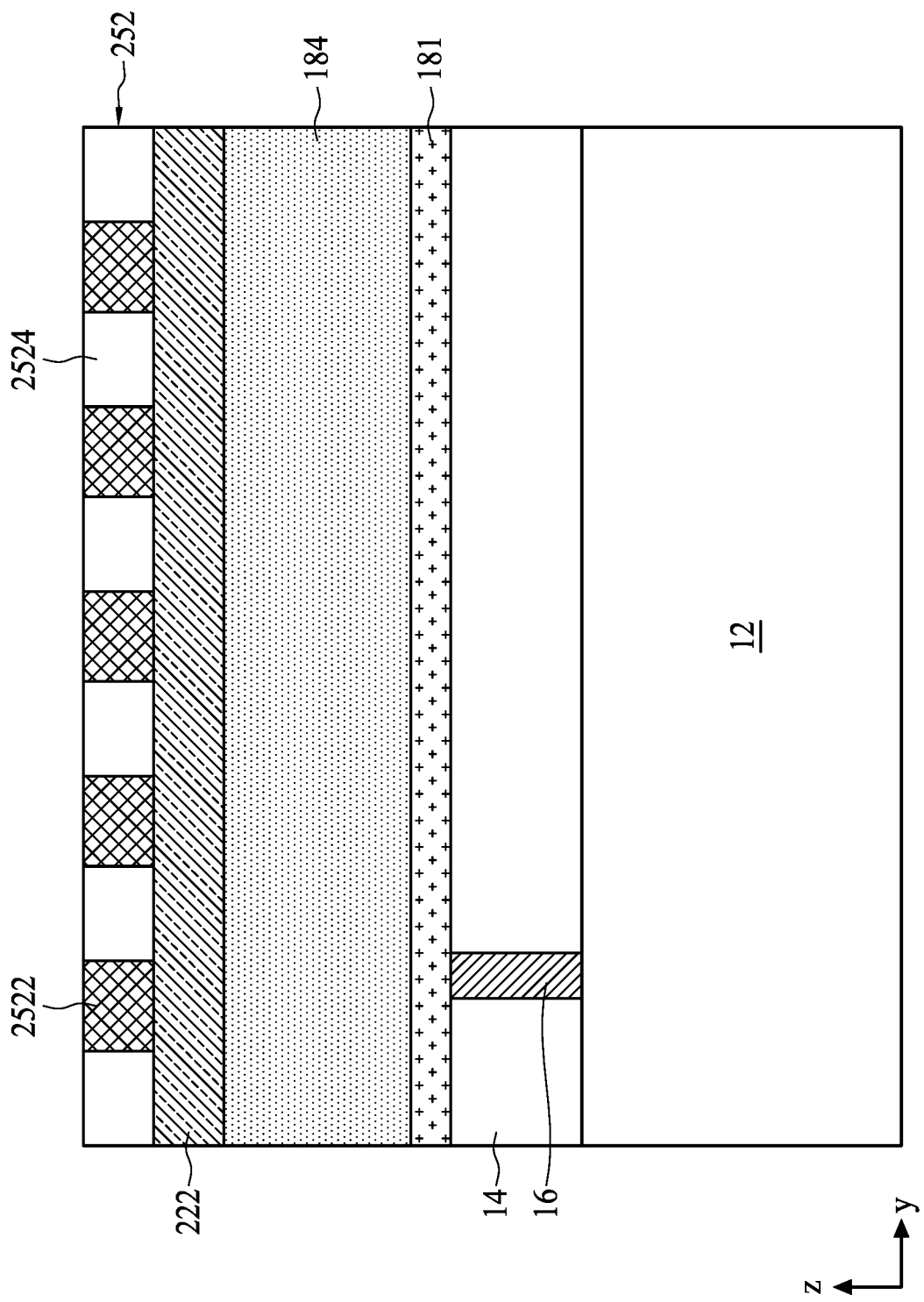
FIG. 30 is a cross-sectional view taken along the line XI-XI illustrated in FIG. 29.

Next, a second photolithography process is performed to expose the second photoresist layer 250 to actinic radiation 270 through the second mask 260 according to a step 416 in FIG. 24. Accordingly, a second photoresist pattern 252 made up of a plurality of second exposed portions 2522 and a plurality of second unexposed portions 2524 are formed, as shown in FIGS. 29 and 30. In some embodiments, the second exposed portions 2522 and the second unexposed portions 2524 are alternatingly arranged along a second direction y perpendicular to the first direction x. In some embodiments, the second mask 260 is then removed from the second photoresist pattern 262.

Figure 31:
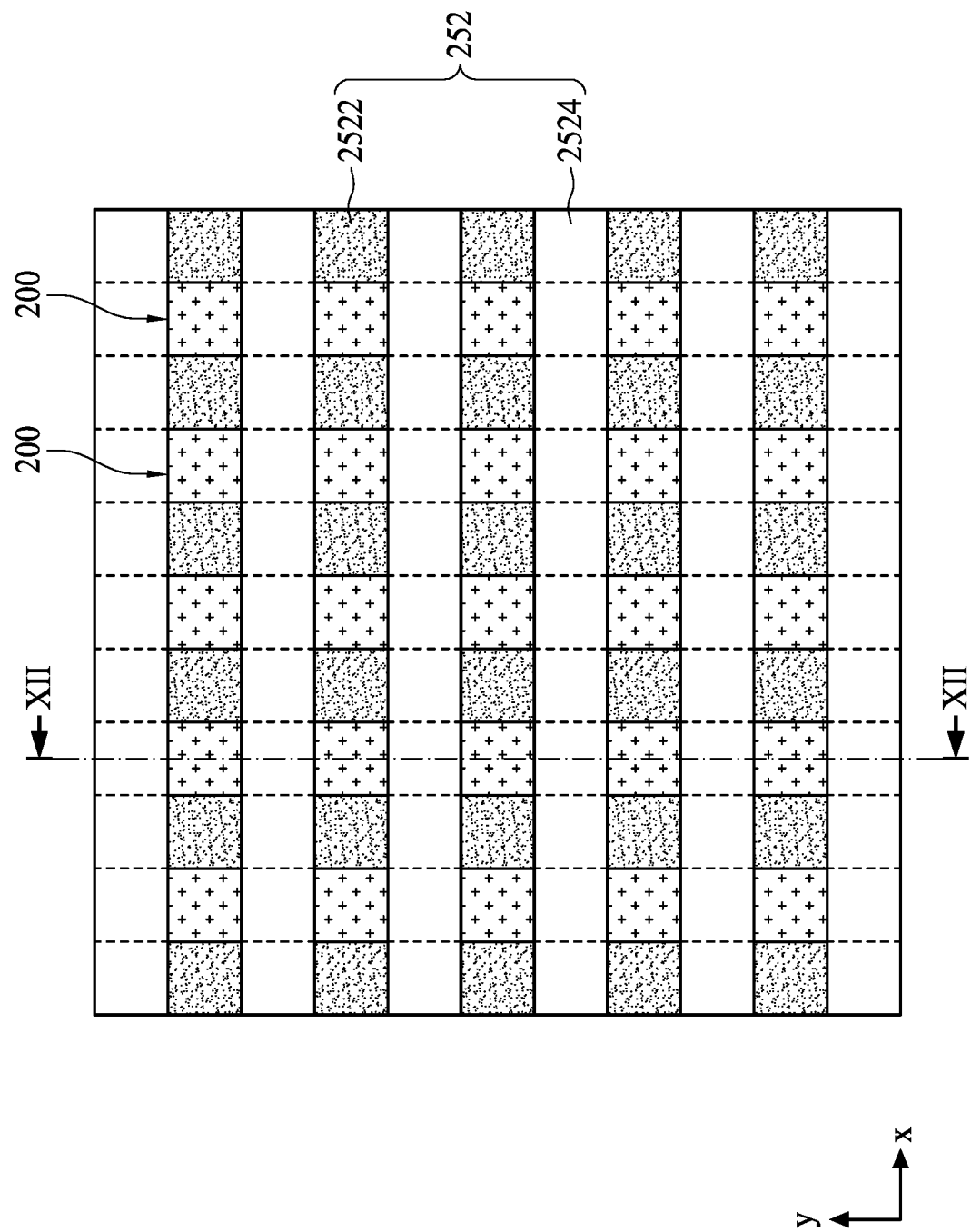
FIG. 31 is a top view of an intermediate stage in the manufacture of the electronic device in accordance with some embodiments of the present disclosure.
Figure 32:
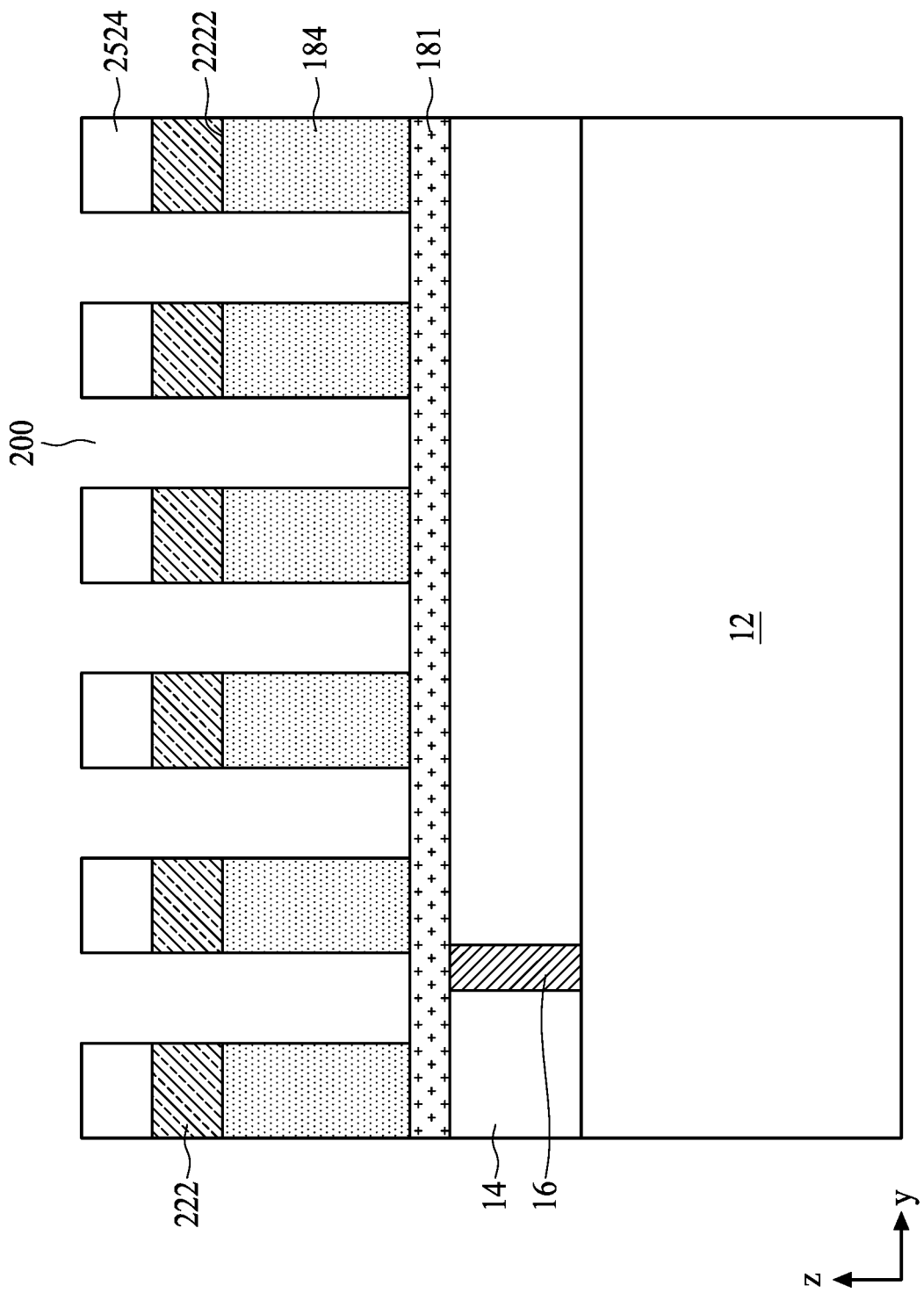
FIG. 32 is a cross-sectional view taken along the line XII-XII illustrated in FIG. 31.
Figure 33:
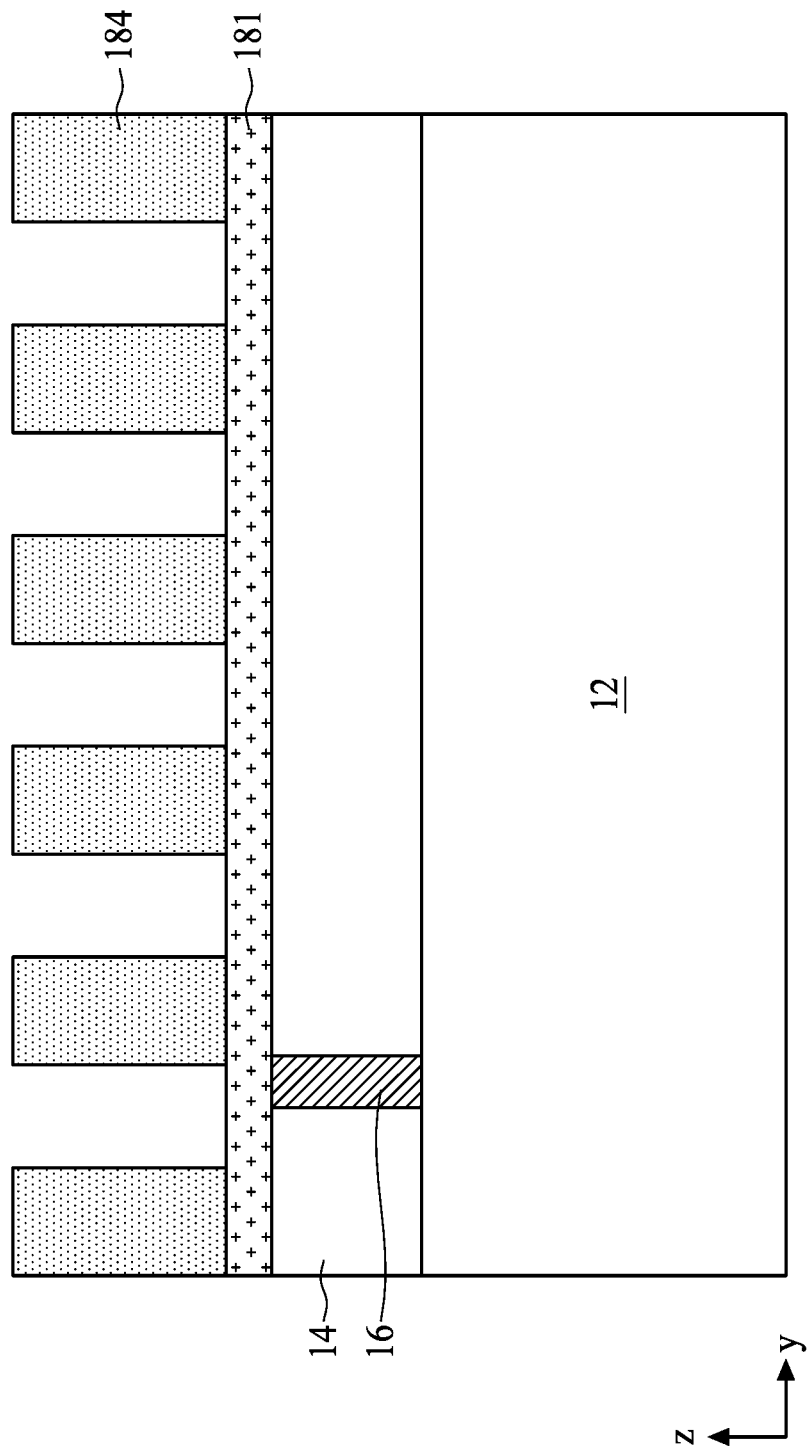
FIGS. 33 through 36 are cross-sectional views of intermediate stages in the manufacture of the electronic device in accordance with some embodiments of the present disclosure.

Referring to FIGS. 31 through 32, in some embodiments, an etching process is performed to form a plurality of trenches 200 according to a step 418 in FIG. 24. In some embodiments, the etching process is used to remove the first exposed portions 2222, the second exposed portions 2522, and portions of the isolation layer 184 at intersections wherein the first exposed portions 2222 and the second exposed portions 2522 intersect, such that the trenches 200 are formed. In some embodiments, the etching process stops at the blanket bottom electrode 181. Referring to FIG. 33, in some embodiments, an ashing process or a wet strip process may be used to remove the first unexposed portions 2224 and the second unexposed portions 2524.

Figure 34:
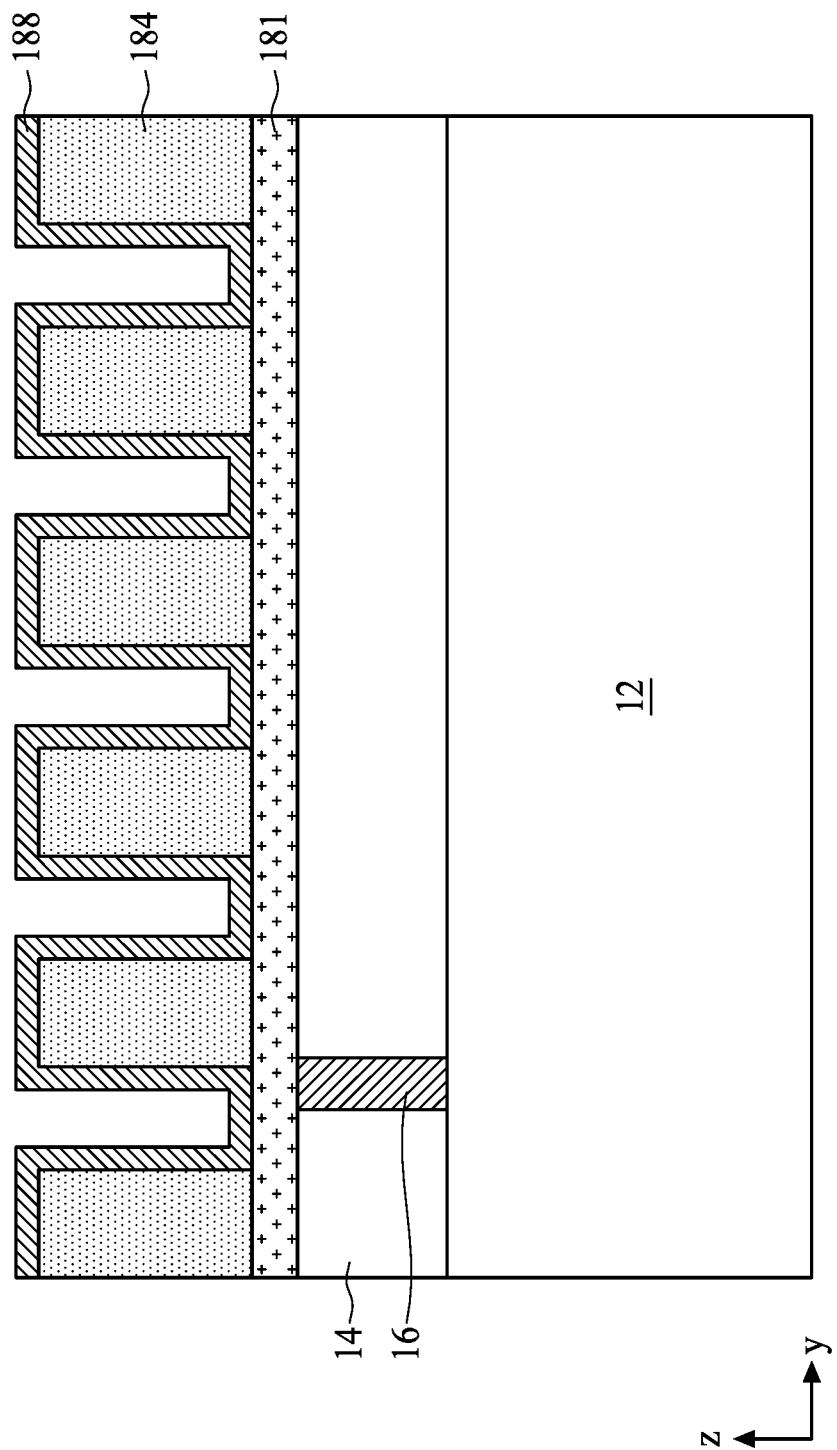

Referring to FIG. 34, in some embodiments, a dielectric layer 188 is deposited on the isolation layer 184 and in the trenches 200 according to a step 420 in FIG. 24. In some embodiments, the dielectric layer 188 conformally extends along a top surface 1842 of the isolation layer 184 and into the trenches 200. In some embodiments, the dielectric layer includes oxide. In some embodiments, the dielectric layer 188 may be formed, for example, using a CVD process.

Figure 35:
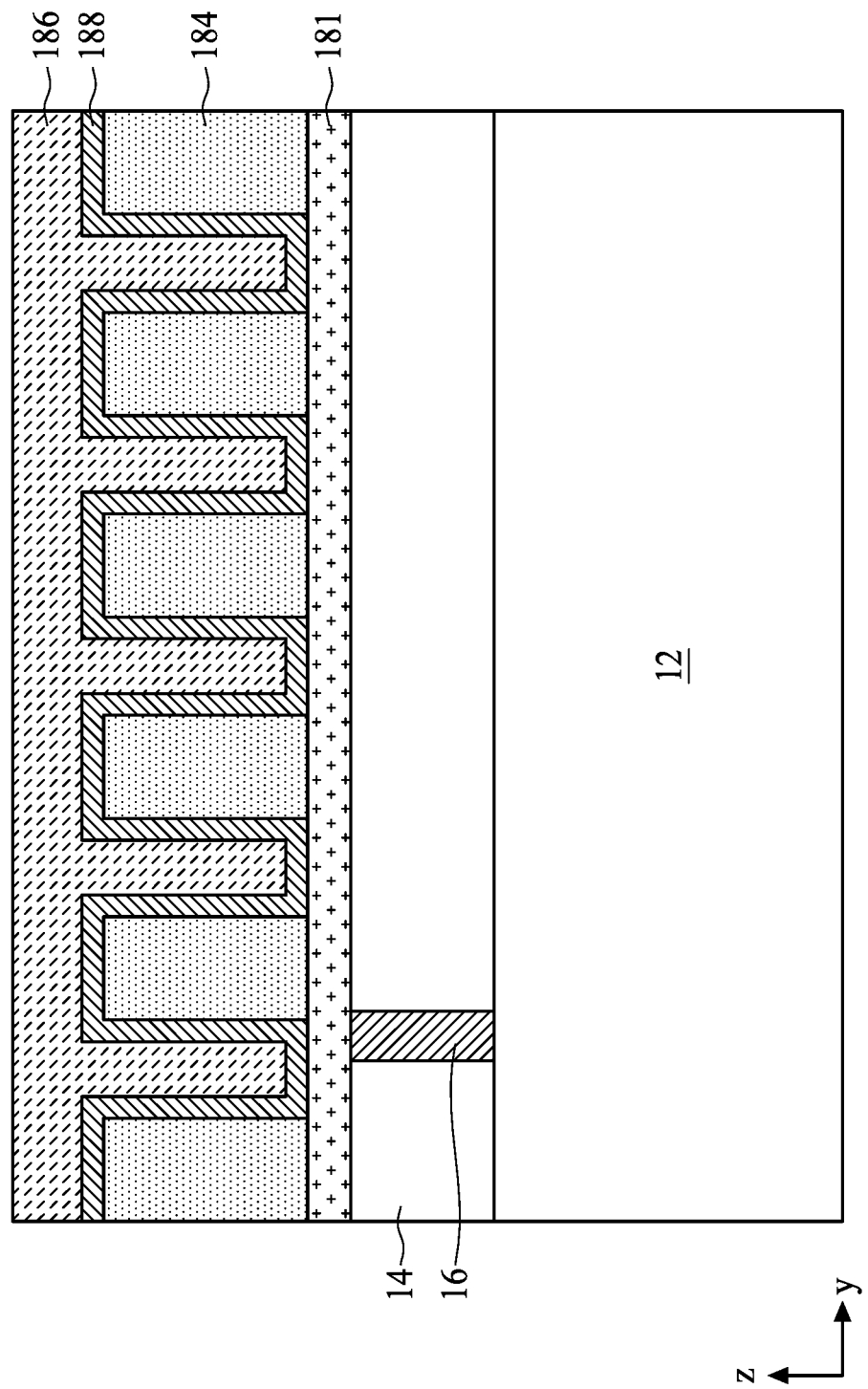

Referring to FIG. 35, a top electrode 186 is deposited on the dielectric layer 188 according to a step 422 in FIG. 24. In some embodiments, the top electrode 186 fully covers the dielectric layer 188. In some embodiments, the top electrode 186 includes copper or a copper alloy. In some embodiments, the formation methods of the top electrode 186 include a plating process, a CVD process, a PVD process or a sputtering process.

Figure 36:
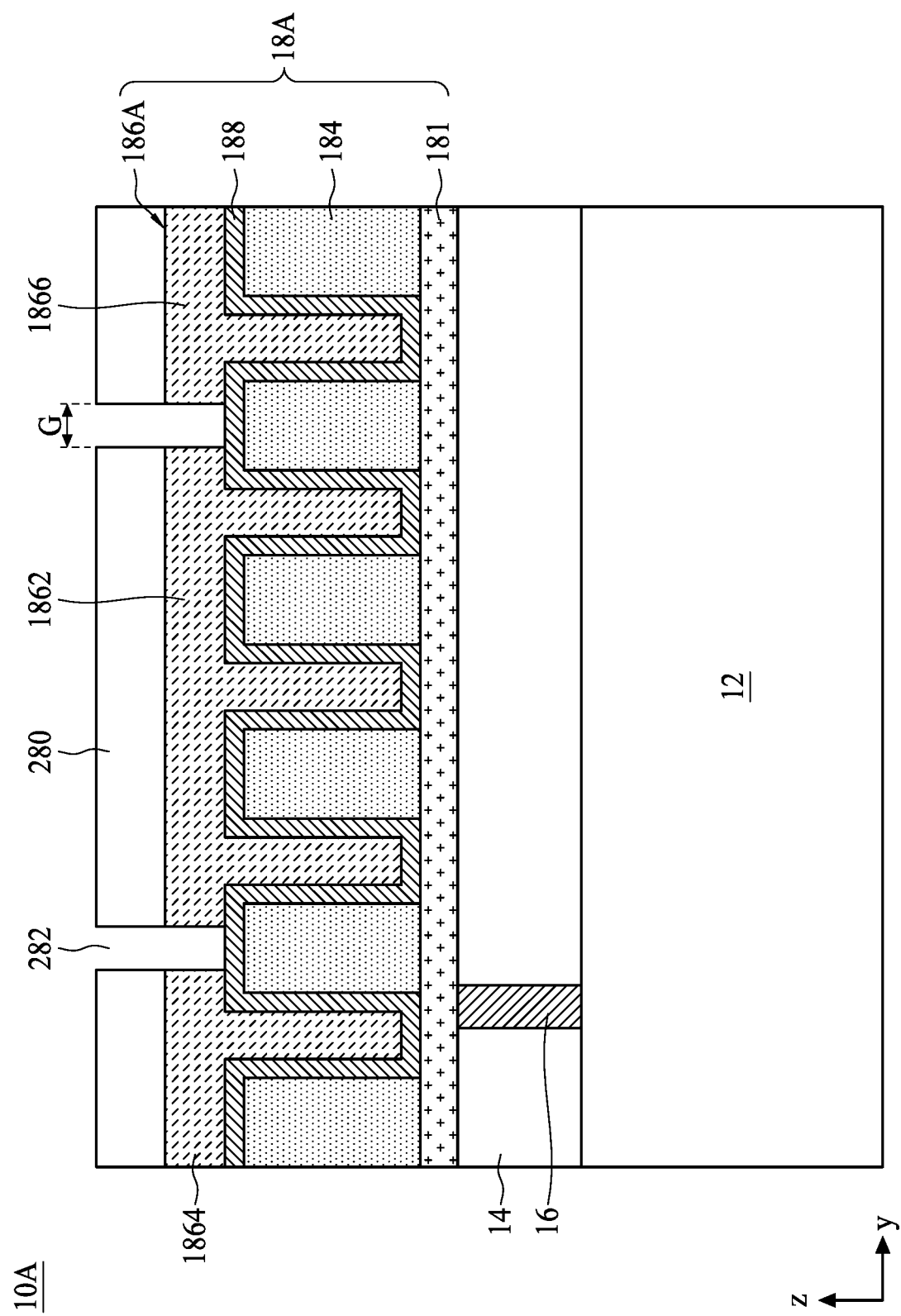

Next, a patterned mask 280 is provided on the top electrode 186 to pattern the top electrode 186 according to a step 424 in FIG. 24. Accordingly, the electronic device 10A, shown in FIGS. 21 through 23, is completely formed. Referring to FIG. 36, in some embodiments, the patterned mask 280 has an opening 282 to expose a portion of the top electrode 186. In some embodiments, an etching process is performed to remove a portion of the top electrode 186. Accordingly, a first segment 1862 and a second segment 1864, as shown in FIGS. 21 through 23, are formed. In some embodiments, the first segment 1862 is separated from the second segment 1864 by a gap G. In some embodiments, the patterned mask 280 on the remaining top electrode 186A including the first segment 1862 and the second segment 1864 is then removed by, for example, a wet etching process.

In conclusion, with the configuration of electronic device 10/10A, the filtering components 18/18A include at least one decoupling capacitor functioning as a noise filter and at least one dummy capacitor functioning as a reinforced structure to prevent the decoupling capacitor from collapse. Thus, noise can be effectively reduced and operation speed of the electronic device 10/10A can be improved.

One aspect of the present disclosure provides an electronic device. The electronic device includes a semiconductor component, an insulating layer, at least one contact plug, and a filtering component. The insulating layer is disposed on the semiconductor component. The contact plug penetrates through the insulating layer. The filtering component is disposed on the insulating layer and the contact plug. The filtering component includes a bottom electrode, an isolation layer, a top electrode, and a dielectric layer. The bottom electrode is divided into a first segment connected to the contact plug and a second segment separated from the first segment. The isolation layer is disposed on the bottom electrode, the top electrode is disposed in the isolation layer, and the dielectric layer is disposed between the bottom electrode and the top electrode.

One aspect of the present disclosure provides an electronic device. The electronic device includes a semiconductor component, an insulating layer, at least one contact plug, and a filtering component. The insulating layer is disposed on the semiconductor component. The contact plug penetrates through the insulating layer. The filtering component is disposed on the insulating layer and the contact plug. The filtering component includes a blanket bottom electrode, an isolation layer, a dielectric layer, and a top electrode. The blanket bottom electrode is disposed on the insulating layer and the contact plug, and the blanket bottom electrode is connected to the contact plug. The isolation layer is disposed on the blanket bottom electrode. The dielectric layer extends along a top surface of the isolation layer and into the isolation layer. The top electrode is disposed on the dielectric layer, and the top electrode comprises a first segment and a second segment separated from each other.

One aspect of the present disclosure provides a method of manufacturing an electronic device. The method includes steps of providing a blanket bottom electrode; patterning the blanket bottom electrode to form a first segment and a second segment separated from each other; depositing an isolation layer on the first segment, on the second segment, and over a gap between the first segment and the second segment; providing a first photoresist layer on the isolation layer; exposing the first photoresist layer to form a first photoresist pattern having a plurality of first exposed portions and a plurality of first unexposed portions; providing a second photoresist layer on the first photoresist pattern; exposing the second photoresist layer to form a second photoresist pattern having a plurality of second exposed portions and a plurality of second unexposed portions; performing an etching process to form a plurality of trenches at intersections wherein the first exposed portions and the second exposed portions intersect; depositing a dielectric layer on the isolation layer and in the trenches; and depositing a top electrode on the dielectric layer.

One aspect of the present disclosure provides a method of manufacturing an electronic device. The method includes steps of providing a blanket bottom electrode; depositing an isolation layer on the blanket bottom electrode; coating a first photoresist layer on the isolation layer; exposing the first photoresist layer to form a first photoresist pattern having a plurality of first exposed portions and a plurality of first unexposed portions; coating a second photoresist layer on the first photoresist pattern; exposing the second photoresist layer to form a second photoresist pattern having a plurality of second exposed portions and a plurality of second unexposed portions; performing an etching process to form a plurality of trenches at intersections wherein the first exposed portions and the second exposed portions intersect; depositing a dielectric layer on the isolation layer and in the trenches; depositing a top electrode on the dielectric layer; and patterning the top electrode to form a first segment and a second segment separated from each other.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing an electronic device, comprising:
   providing a blanket bottom electrode;
   patterning the blanket bottom electrode to form a first segment and a second segment separated from each other;
   depositing an isolation layer on the first segment, on the second segment, and over a gap between the first segment and the second segment;
   providing a first photoresist layer on the isolation layer;
   exposing the first photoresist layer to form a first photoresist pattern having a plurality of first exposed portions and a plurality of first unexposed portions;
   providing a second photoresist layer on the first photoresist pattern;
   exposing the second photoresist layer to form a second photoresist pattern having a plurality of second exposed portions and a plurality of second unexposed portions;
   performing an etching process to form a plurality of trenches at intersections wherein the first exposed portions and the second exposed portions intersect;
   depositing a dielectric layer on the isolation layer and in the trenches; and
   depositing a top electrode on the dielectric layer.

2. The method of claim 1, wherein the second unexposed portions are disposed over the gap.

3. The method of claim 1, wherein the first exposed portions and the first unexposed portions are alternatingly arranged along a first direction, and the second exposed portions and the second unexposed portions are alternatingly arranged along a second direction perpendicular to the first direction.

4. The method of claim 1, further comprising removing the first unexposed portions and the second unexposed portions before the deposition of the dielectric layer.

5. The method of claim 1, wherein the dielectric layer is a conformal layer.

6. The method of claim 1, further comprising:
   providing semiconductor component;
   depositing an insulating layer on the semiconductor component; and
   forming at least one contact plug in the insulating layer before the providing of the blanket bottom electrode.

7. The method of claim 6, wherein the first segment is in contact with the contact plug.

8. A method of manufacturing an electronic device, comprising:
   providing a blanket bottom electrode;
   depositing an isolation layer on the blanket bottom electrode;
   coating a first photoresist layer on the isolation layer;
   exposing the first photoresist layer to form a first photoresist pattern having a plurality of first exposed portions and a plurality of first unexposed portions;
   coating a second photoresist layer on the first photoresist pattern;
   exposing the second photoresist layer to form a second photoresist pattern having a plurality of second exposed portions and a plurality of second unexposed portions;
   performing an etching process to form a plurality of trenches at intersections wherein the first exposed portions and the second exposed portions intersect;
   depositing a dielectric layer on the isolation layer and in the trenches;
   depositing a top electrode on the dielectric layer; and
   patterning the top electrode to form a first segment and a second segment separated from each other.

9. The method of claim 8, wherein the first exposed portions and the first unexposed portions are alternatingly arranged along a first direction, and the second exposed portions and the second unexposed portions are alternatingly arranged along a second direction perpendicular to the first direction.

10. The method of claim 8, further comprising removing the first unexposed portions and the second unexposed portions before the deposition of the dielectric layer.

11. The method of claim 8, wherein the dielectric layer is a conformal layer.

12. The method of claim 8, further comprising:
    providing semiconductor component;
    depositing an insulating layer on the semiconductor component; and
    forming at least one contact plug in the insulating layer before the providing of the blanket bottom electrode.

* * * * *